United States Patent
Chuang et al.

(10) Patent No.: US 11,302,798 B2
(45) Date of Patent: Apr. 12, 2022

(54) SEMICONDUCTOR DEVICES WITH AIR GATE SPACER AND AIR GATE CAP

(71) Applicant: Taiwan Semiconductor Manufacturing Co., Ltd., Hsin-Chu (TW)

(72) Inventors: Cheng-Chi Chuang, New Taipei (TW); Lin-Yu Huang, Hsinchu (TW); Chia-Hao Chang, Hsinchu (TW); Yu-Ming Lin, Hsinchu (TW); Ting-Ya Lo, Hsinchu (TW); Chi-Lin Teng, Taichung (TW); Hsin-Yen Huang, New Taipei (TW); Hai-Ching Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 50 days.

(21) Appl. No.: 16/888,138

(22) Filed: May 29, 2020

(65) Prior Publication Data
US 2021/0376111 A1  Dec. 2, 2021

(51) Int. Cl.
*H01L 29/66* (2006.01)
*H01L 29/49* (2006.01)
(Continued)

(52) U.S. Cl.
CPC .. *H01L 29/6656* (2013.01); *H01L 21/823468* (2013.01); *H01L 29/4991* (2013.01);
(Continued)

(58) Field of Classification Search
CPC ............. H01L 29/6656; H01L 29/6653; H01L 29/4991; H01L 29/66795; H01L 21/823468
See application file for complete search history.

(56) References Cited

U.S. PATENT DOCUMENTS 6,265,321 B1 * 7/2001 Chooi ................ H01L 21/7682
257/E21.579
8,772,109 B2   7/2014 Colinge
(Continued)

OTHER PUBLICATIONS

Huang, Lin-Yu, et al. "Method for Forming Source/Drain Contacts Utilizing an Inhibitor", U.S. Appl. No. 16/881,481, filed May 22, 2020, Assignee: Taiwan Semiconductor Manufacturing Co., Ltd., 27 pages specification, 16 pages drawings.
(Continued)

*Primary Examiner* — Tuan A Hoang
(74) *Attorney, Agent, or Firm* — Haynes and Boone, LLP

(57) ABSTRACT

A method includes providing a structure having a gate stack; first gate spacers; a second gate spacer over one of the first gate spacers and having an upper portion over a lower portion; a dummy spacer; an etch stop layer; and a dummy cap. The method further includes removing the dummy cap, resulting in a first void above the gate stack and between the first gate spacers; removing the dummy spacer, resulting in a second void above the lower portion and between the etch stop layer and the upper portion; depositing a layer of a decomposable material into the first and the second voids; depositing a seal layer over the etch stop layer, the first and the second gate spacers, and the layer of the decomposable material; and removing the layer of the decomposable material, thereby reclaiming at least portions of the first and the second voids.

20 Claims, 27 Drawing Sheets

(51) Int. Cl.
*H01L 29/78* (2006.01)
*H01L 21/8234* (2006.01)

(52) U.S. Cl.
CPC .... *H01L 29/6653* (2013.01); *H01L 29/66795* (2013.01); *H01L 29/785* (2013.01)

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,962,400 B2 | 2/2015 | Tsai et al. |
| 9,093,514 B2 | 7/2015 | Tsai et al. |
| 9,105,490 B2 | 8/2015 | Wang et al. |
| 9,236,267 B2 | 1/2016 | De et al. |
| 9,236,300 B2 | 1/2016 | Liaw |
| 9,245,805 B2 | 1/2016 | Yeh et al. |
| 9,520,482 B1 | 12/2016 | Chang et al. |
| 9,576,814 B2 | 2/2017 | Wu et al. |
| 10,522,642 B2 | 12/2019 | Lee et al. |
| 2007/0296039 A1* | 12/2007 | Chidambarrao .... H01L 29/6653 257/355 |
| 2012/0037962 A1* | 2/2012 | Breyta ................. H01L 23/4821 257/288 |
| 2018/0005876 A1 | 1/2018 | Tung et al. |
| 2018/0047642 A1* | 2/2018 | Thees ................. H01L 21/2652 |
| 2019/0074364 A1* | 3/2019 | Schutz ................ H01L 29/6656 |
| 2021/0249310 A1* | 8/2021 | Chou .................... H01L 29/456 |

OTHER PUBLICATIONS

Chu, Lung-Kun, et al. "Dipole Patterning for CMOS Devices", U.S. Appl. No. 16/879,613, filed May 20, 2020, Assignee: Taiwan Semiconductor Manufacturing Co., Ltd., 31 pages specification, 26 pages drawings.

Huang, Mao-Lin, et al., "Gate Patterning Process for Multi-Gate Devices", U.S. Appl. No. 16/858,440, filed Apr. 24, 2020, Assignee: Taiwan Semiconductor Manufacturing Co., Ltd., 32 pages specification, 38 pages drawings.

Huang, Wang-Chun, et al., "Semiconductor Devices with Improved Capacitors", U.S. Appl. No. 16/802,396, filed Feb. 26, 2020, Assignee: Taiwan Semiconductor Manufacturing Co., Ltd., 30 pages specification, 29 pages drawings.

* cited by examiner

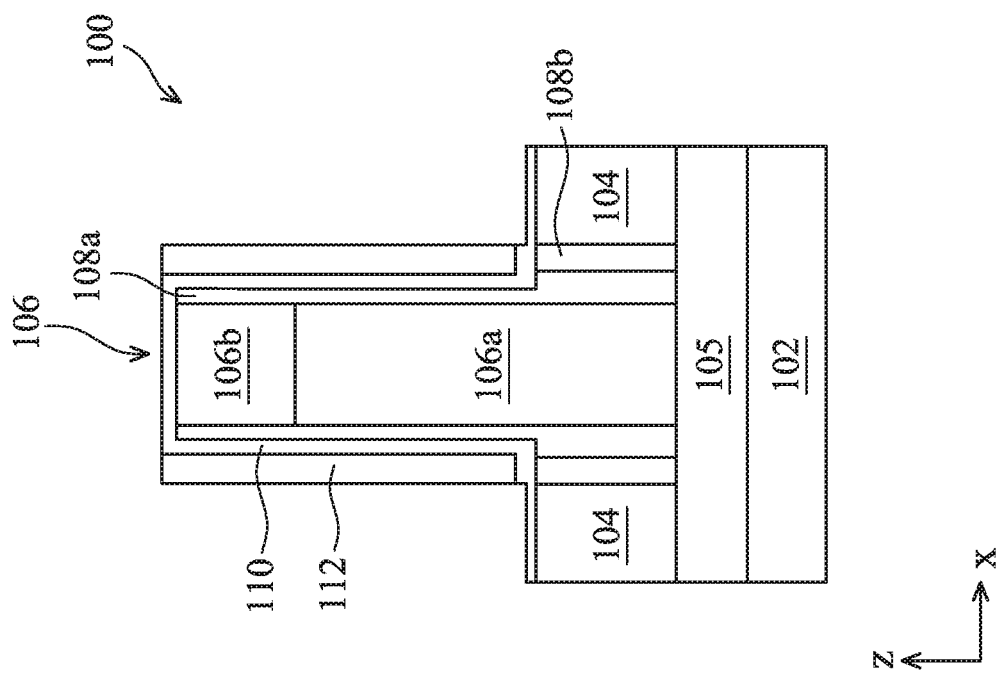
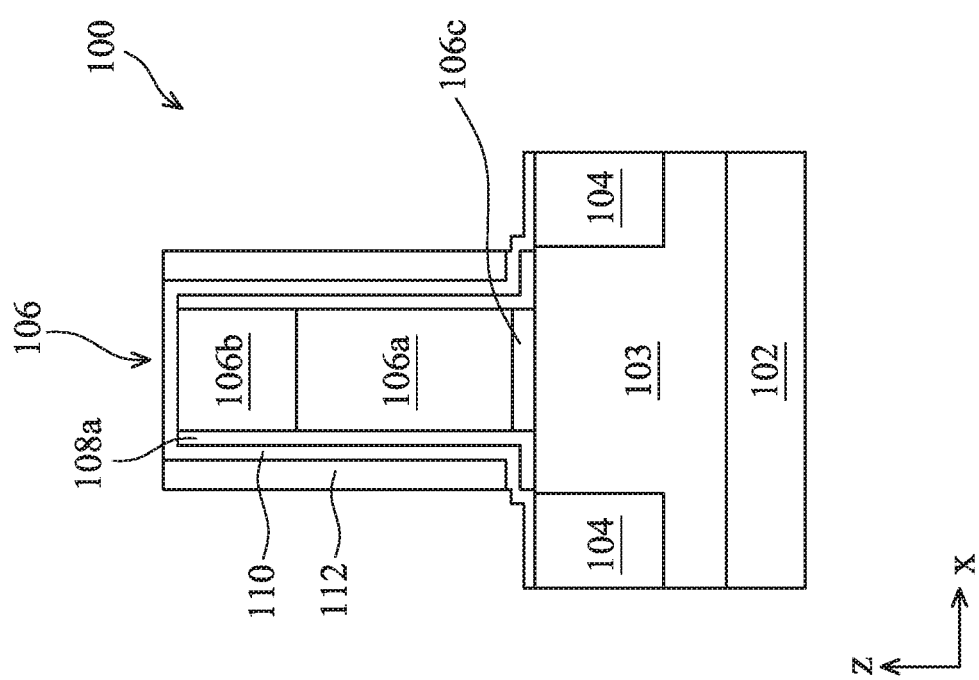
FIG. 5A
FIG. 5B

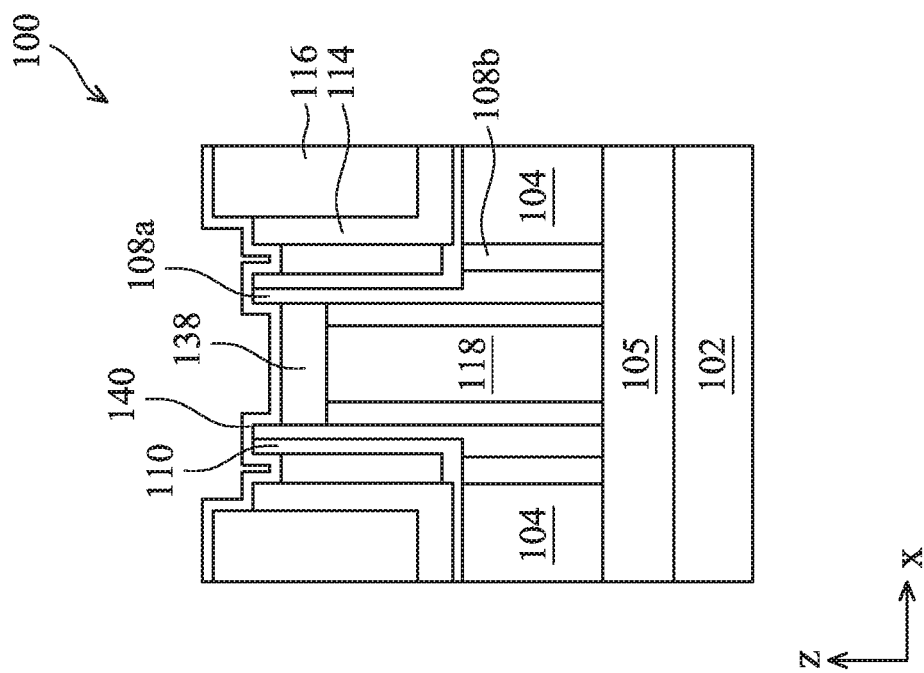
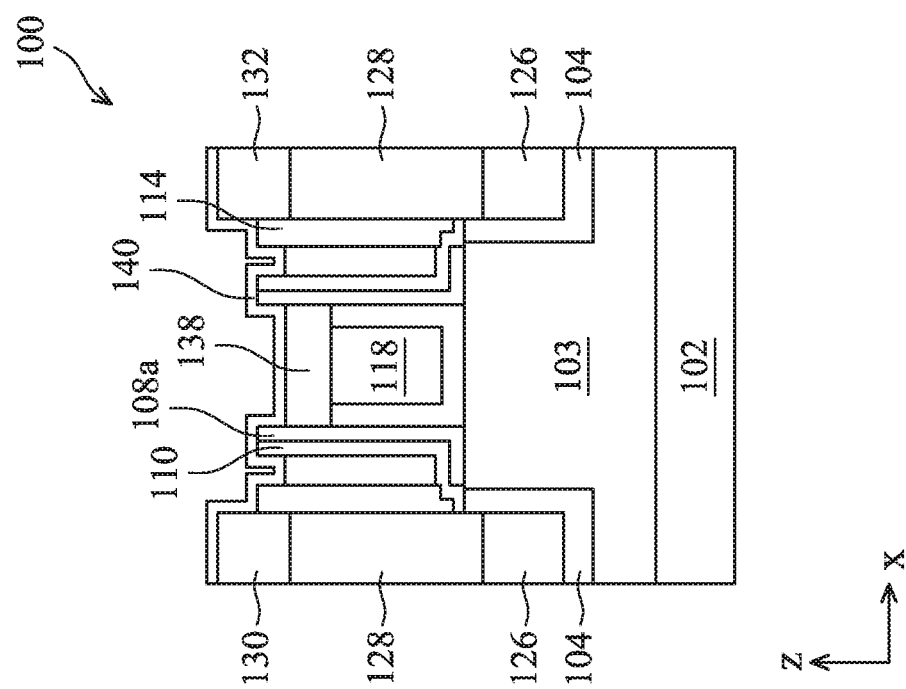
FIG. 20A
FIG. 20B

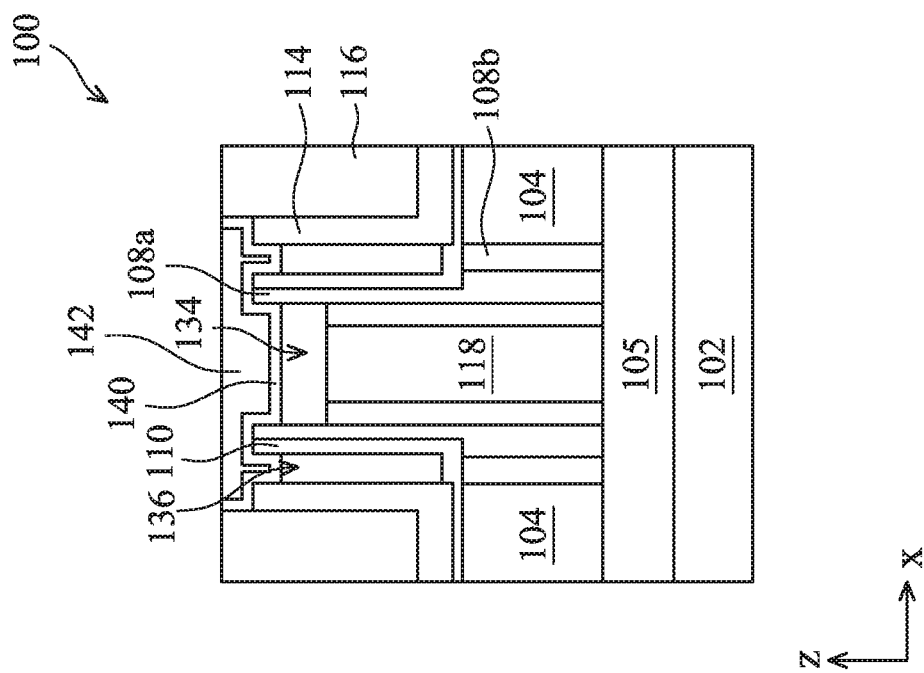
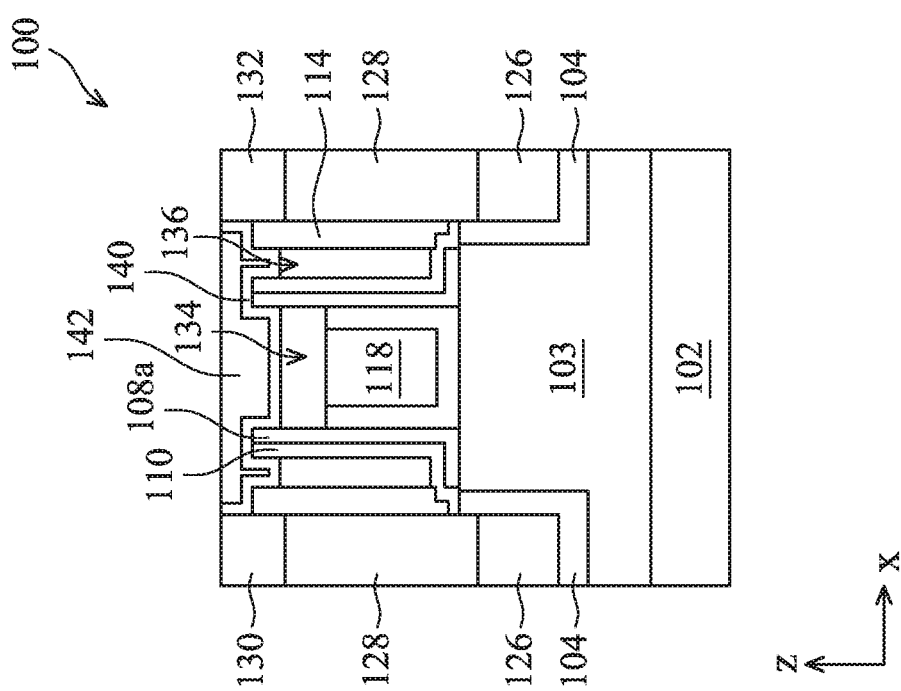

SEMICONDUCTOR DEVICES WITH AIR GATE SPACER AND AIR GATE CAP

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. Hence, semiconductor manufacturing processes need continued improvements. One area of improvements is how to reduce stray capacitance among features of field effect transistors.

It is generally desired to reduce stray capacitance in transistors, such as capacitance between a gate and source/drain contacts, in order to increase switching speed, decrease switching power consumption, and/or decrease coupling noise of the transistors. Certain low-k materials have been suggested as insulator materials in transistors to reduce stray capacitance. However, as semiconductor technology progresses to smaller geometries, the distances between the gate and source/drain contacts are further reduced, which increases stray capacitance. Additionally, the isolation between a gate and conductor near the gate also becomes problematic as the scaling down continues. Therefore, although existing approaches in transistor formation have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2B, 3A, 4A, 5A, 6A, 7A, 8A, 9A, 10A, 11A, 12A, 13A, 14A, 15A, 16A, 17, 18, 19A, 20A, 21A, 22A, 23, 25, and 26 illustrate cross-sectional views of a portion of a semiconductor device along the A-A line in FIG. 2A, according to some embodiments.

FIGS. 2C, 3B, 4B, 5B, 6B, 7B, 8B, 9B, 10B, 11B, 12B, 13B, 14B, 15B, 16B, 19B, 20B, 21B, 22B, and 24 illustrate cross-sectional views of a portion of a semiconductor device along the B-B line in FIG. 2A, according to some embodiments.

DETAILED DESCRIPTION

Figure 1A:
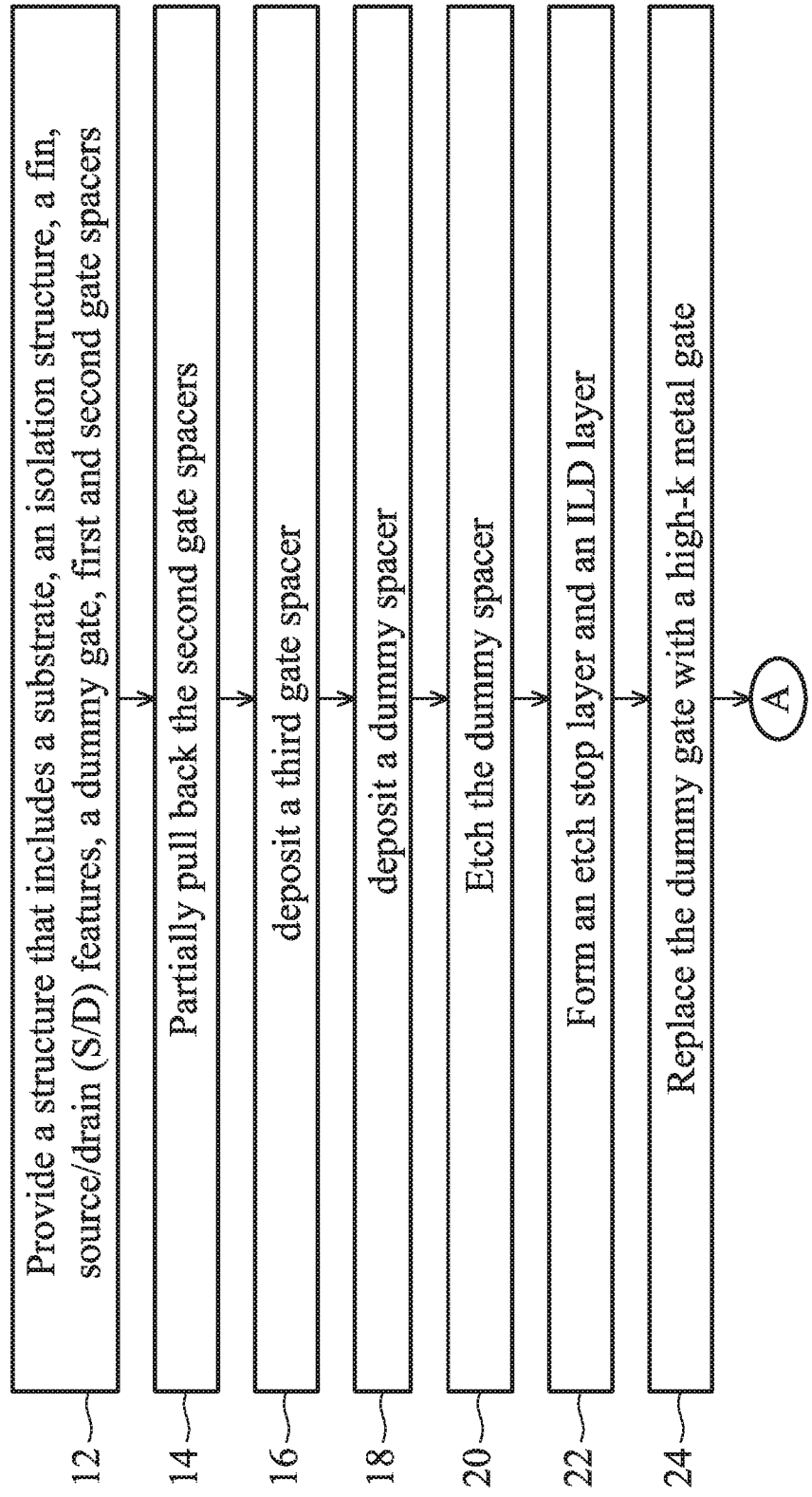
FIGS. 1A and 1B show a flow chart of a method of forming a semiconductor device with air gate spacer and air gate cap, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure relates to a semiconductor fabrication process and the structure thereof. More particularly, the present disclosure relates to providing methods and structures for lowering stray capacitance and increasing isolation between gates and source/drain contacts and between gates and nearby conductors (such as metal lines above the gates) in field effect transistors (FETs). When forming FETs, it is desired to increase switching speed, decrease switching power consumption, and decrease coupling noise. Stray capacitance generally has a negative impact on these parameters, especially from stray capacitance between gates and source/drain contacts. As semiconductor technology progresses to smaller geometries, the distances between the gates and source/drain contacts shrink, resulting in larger stray capacitance. Consequently, stray capacitance in FETs has become more problematic. Another problem relates to the isolation between gates and nearby conductive features such as source/drain, silicide, contacts, vias, and metal lines. With the small dimensions in the transistors, metal elements might diffuse and migrate through dielectric layers over time, causing device failure after some time in operation. The present disclosure provides solutions in forming air gate spacers and air gate caps that surround a gate instead of spacers and caps made of a solid dielectric material. This effectively lowers the stray capacitance between the gate and source/drain contacts as well as increases the isolation between the gate and nearby conductive features. These and other aspects of the present disclosure are further described by referring to the accompanied figures.

Figure 1B:
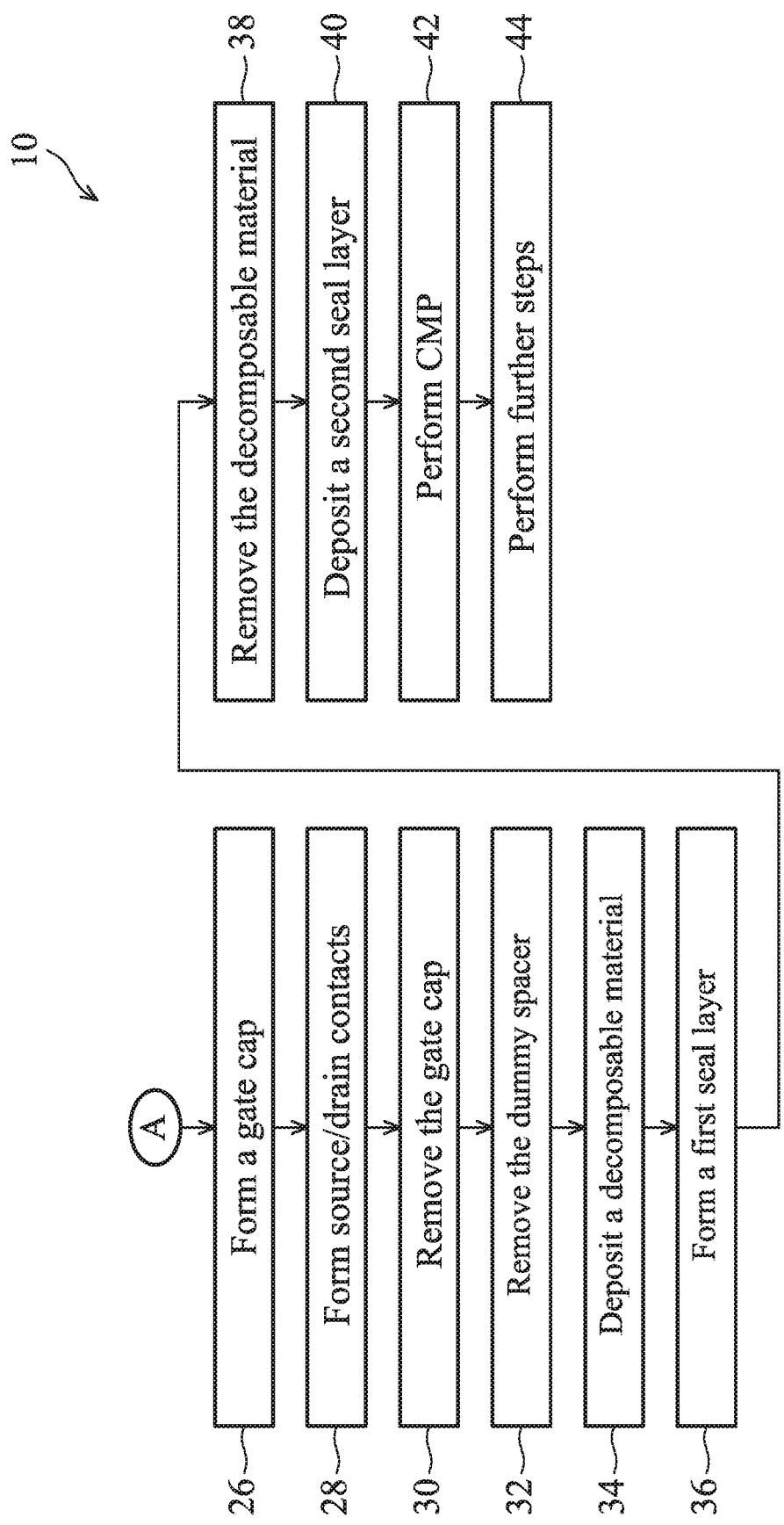

FIGS. 1A and 1B are a flow chart of a method 10 for fabricating a semiconductor device according to various aspects of the present disclosure. Additional processing is contemplated by the present disclosure. Additional operations can be provided before, during, and after method 10, and some of the operations described can be moved, replaced, or eliminated for additional embodiments of method 10.

Method 10 is described below in conjunction with FIGS. 2A-26 that illustrate various perspective and cross-sectional views of a semiconductor device 100 at various steps of fabrication according to the method 10, in accordance with some embodiments. In some embodiments, the device 100 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the device 100 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 2A-26 have been simplified for the sake of clarity to better understand the inventive concepts of the present disclosure. Additional features can be added in the device 100, and some of the features described below can be replaced, modified, or eliminated in other embodiments of the device 100.

Figure 2A:
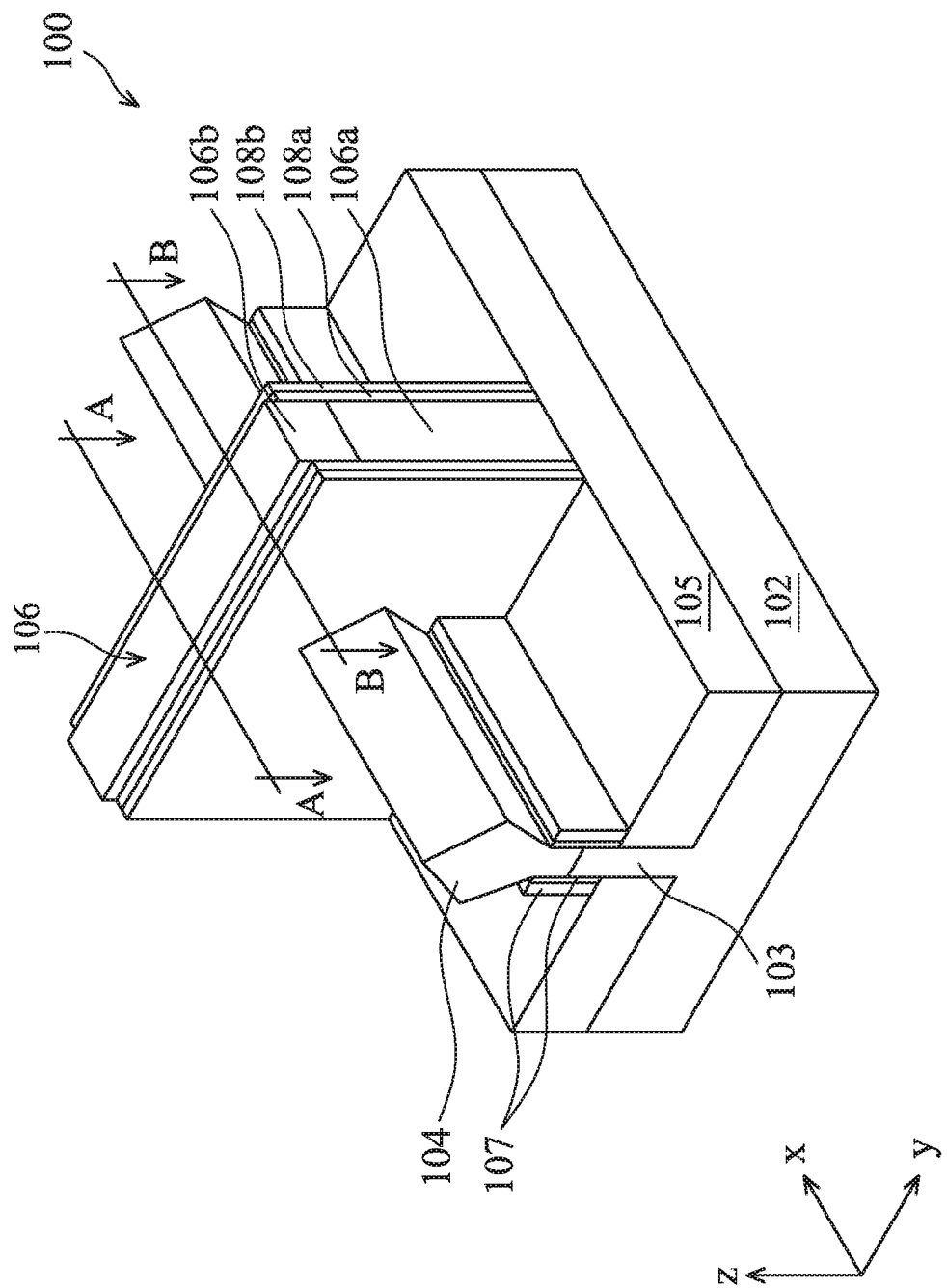
FIG. 2A illustrates a perspective view of a portion of a semiconductor device, according to an embodiment, in an intermediate step of fabrication according to an embodiment of the method of FIGS. 1A and 1B.
Figure 2C:
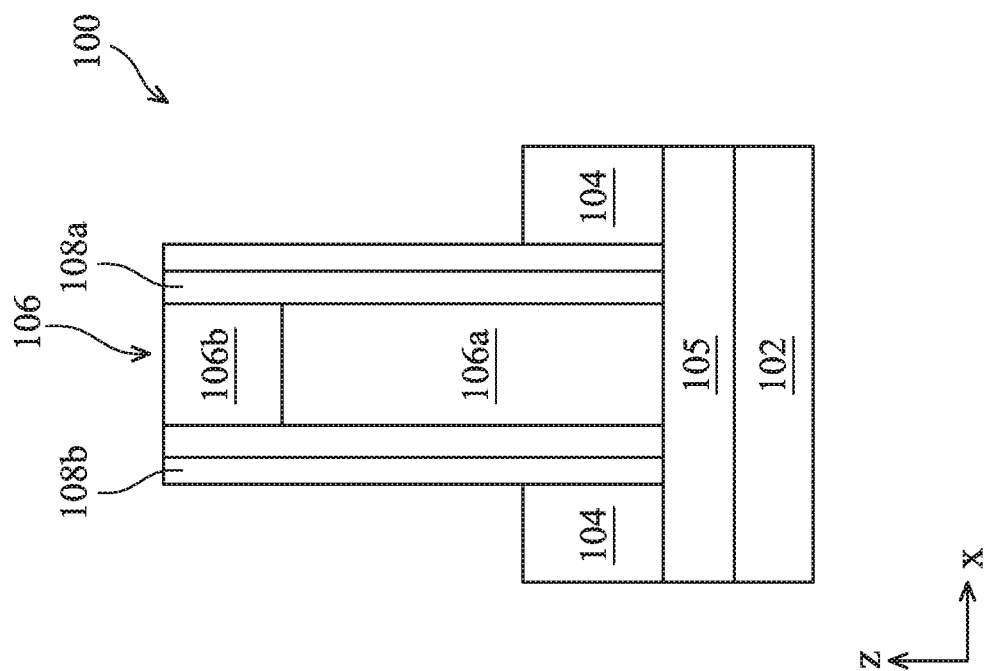
Figure 2B:
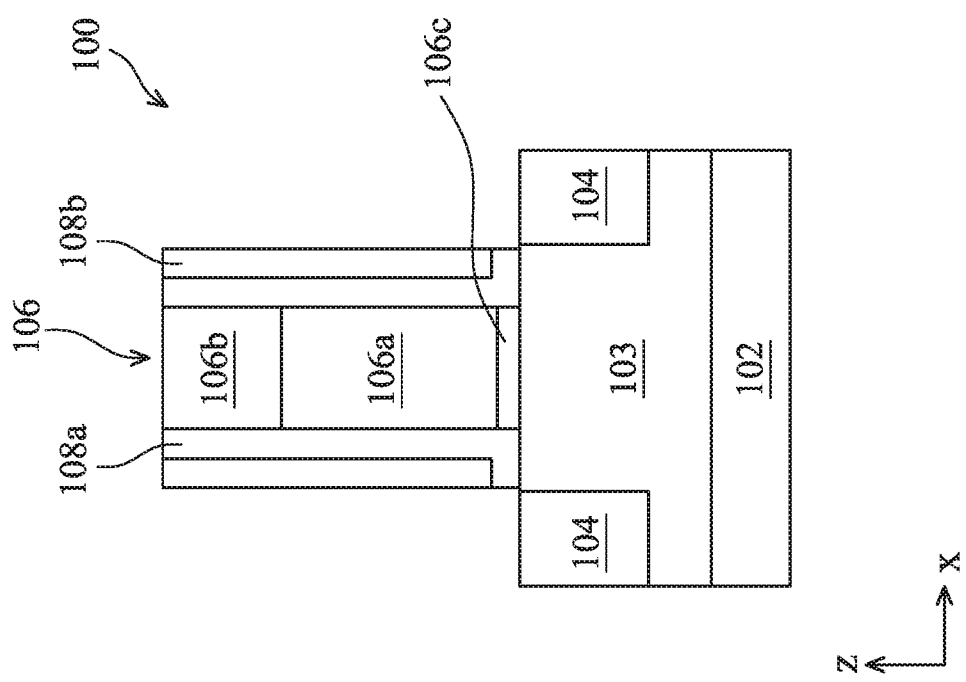

At operation 12, the method 10 (FIG. 1A) provides a structure of the device 100, an embodiment of which is illustrated in FIGS. 2A, 2B, and 2C. Particularly, FIG. 2A illustrates a perspective view of a portion of the device 100 according to an embodiment, which includes an active region 103 and a gate stack 106. The active region 103 is oriented lengthwise generally along the "x" direction, and the gate stack 106 is oriented lengthwise generally along the "y" direction perpendicular to the "x" direction. FIG. 2B illustrates a cross-sectional view of a portion of the device 100 along the A-A line in FIG. 2A according to an embodiment which is cut parallel to the active region 103 and through the active region 103. FIG. 2C illustrates a cross-sectional view of a portion of the device 100 along the B-B line in FIG. 2A according to an embodiment, which is cut parallel to the active region 103 and offset from the active region 103. In the present embodiment, the active region 103 is a semiconductor fin. Hereinafter the active region 103 is also referred to as semiconductor fin 103 or fin 103. The active region 103 may be of other shapes or configurations in other embodiments. The device 100 may include any number of fins 103 and any number of gate stacks 106 in various embodiments.

Referring to FIGS. 2A-2C collectively, the device 100 includes a substrate 102, over which the fin 103 and the gate stack 106 are formed. The device 100 includes an isolation structure 105 for isolating the fin 103 from other active regions or fins. The fin 103 extends from the substrate 102 and above the isolation structure 105. The gate stack 106 is disposed above the isolation structure 105 and on three sides of the fin 103. The device 100 further includes gate spacers 108a and 108b on sidewalls of the gate stack 106 and optional fin sidewall spacers 107 on some sidewalls of the fin 103. The device 100 further includes S/D features 104 on top of the fin 103 and on both sides of the gate stack 106.

The substrate 102 is a silicon (Si) substrate in the present embodiment, such as a silicon wafer. In alternative embodiments, the substrate 102 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium (SiGe), silicon germanium carbide (SiGeC), gallium arsenic phosphide (GaAsP), and gallium indium phosphide (GaInP). In embodiments, the substrate 102 may include silicon on insulator (SOI) substrate, be strained and/or stressed for performance enhancement, include epitaxial regions, doped regions, and/or include other suitable features and layers.

The fin 103 may include one or more layers of semiconductor materials such as silicon or silicon germanium. The fin 103 may be patterned by any suitable method. For example, the fin 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fin 103. For example, the masking element may be used for etching recesses into semiconductor layers over or in the substrate 102, leaving the fin 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fin 103 may be suitable. In some embodiment where the device 100 includes gate-all-around transistors such as nanosheet devices or nanowire devices, the fin 103 include multiple layers of semiconductor materials (such as silicon) that are vertically stacked (along the "z" direction) and portions of the gate stack 106 wrap around each of the multiple layers of semiconductor materials in the channel region of the transistor.

The S/D features 104 include epitaxially grown semiconductor materials such as epitaxially grown silicon, germanium, or silicon germanium. The S/D features 104 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D features 104 may be doped with n-type dopants and/or p-type dopants. In some embodiments, for n-type transistors, the S/D features 104 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the S/D features 104 include silicon germanium or germanium, and can be doped with boron, other p-type dopant, or combinations thereof (for example, forming Si:Ge:B epitaxial S/D features). The S/D features 104 may include multiple epitaxial semiconductor layers having different levels of dopant density. In some embodiments, annealing processes (e.g., rapid thermal annealing (RTA) and/or laser annealing) are performed to activate dopants in the epitaxial S/D features 104.

The isolation structure 105 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 105 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 105. Other types of isolation structure may also be suitable, such as field oxide and LOCal Oxidation of Silicon (LOCOS). The isolation structure 105 may include a multi-layer structure, for example, having one or more liner layers (e.g., silicon nitride) on surfaces of the substrate 102 and the fin 103 and a main isolating layer (e.g., silicon dioxide) over the one or more liner layers.

In the present embodiment, the gate stack 106 is a sacrificial (or dummy) gate stack that will be replaced with a functional gate stack during a later operation of the method 100. The gate stack 106 includes a sacrificial gate dielectric layer 106c, a sacrificial electrode layer 106a over the sacrificial gate dielectric layer 106c, and a hard mask layer 106b over the sacrificial electrode layer 106a. The sacrificial gate dielectric layer 106c may include a dielectric material such as silicon oxide (e.g., $SiO_2$) or silicon oxynitride (e.g., SiON), and may be formed by chemical oxidation, thermal oxidation, atomic layer deposition (ALD), CVD, and/or other suitable methods. The sacrificial gate electrode layer 106a may include poly-crystalline silicon (poly-Si) or other material(s) and may be formed by suitable deposition processes such as low-pressure chemical vapor deposition (LPCVD) and plasma-enhanced CVD (PECVD). The hard mask layer 106b may include one or more layers of dielectric material such as silicon oxide, silicon oxynitride, and/or silicon nitride and may be formed by CVD or other suitable methods. The various layers 106a, 106b, and 106c may be patterned by photolithography and etching processes.

Each of the fin sidewall spacers 107 and the gate spacers 108a and 108b may be a single layer or multi-layer structure. In some embodiments, each of the spacers 107, 108a, and 108b includes a dielectric material, such as silicon oxide ($SiO_2$), silicon nitride ($Si_3N_4$), silicon oxynitride (SiON), other dielectric material, or combination thereof. In an example, the spacers 107, 108a, and 108b are formed by deposition and etching (e.g., anisotropic etching) processes. In some embodiments, the fin sidewall spacers 107 may be completely removed by such etching process. In some embodiment, the gate spacer 108a includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). In some embodiment, the gate spacer 108b includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). In an embodiment, the gate spacers 108a and 108b include different materials. In another embodiment, the gate spacers 108a and 108b include the same materials.

Figure 3B:
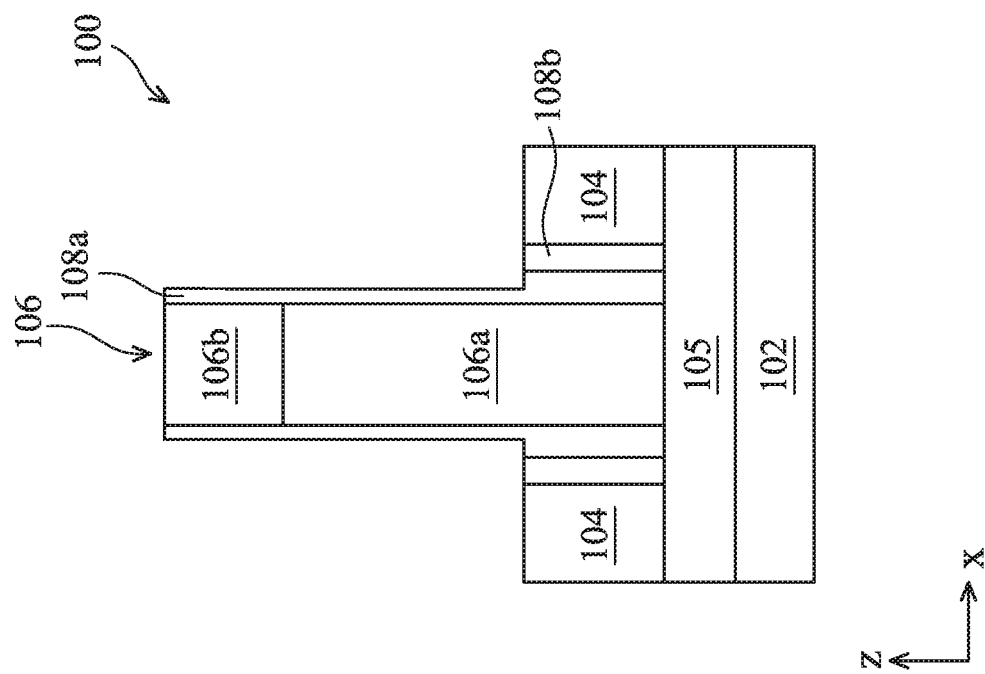
Figure 3A:
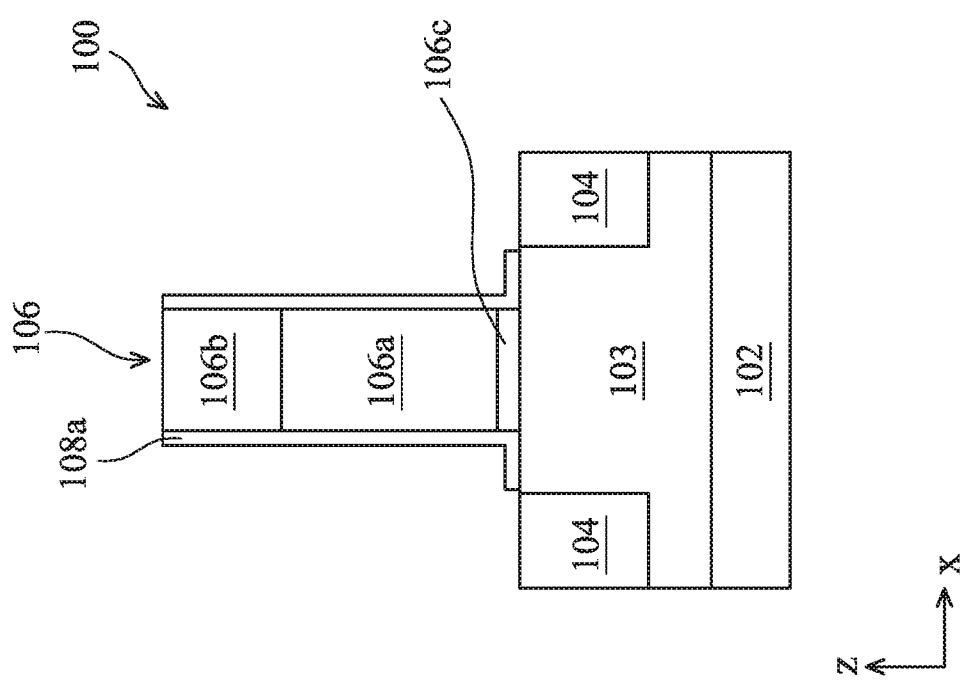

At operation 14, the method 10 (FIG. 1A) partially etches the gate spacers 108b so that the top surface of the gate spacer 108b is even with or below the top surface of the fin 103. This is also referred to as a partial pull-back process. As shown in FIG. 3A, the gate spacer 108b is removed from the top of the fin 103. As shown in FIG. 3B, a portion of the gate spacer 108b remains on sidewalls of the gate spacer 108a on the sides of the fin 103. In an embodiment, the operation 14 applies an isotropic etching, such as an isotropic chemical etching, to partially pull back the gate spacer 108b. The etchant is tuned selective to the materials of the gate spacer 108b, and with no (or little) etching to the hard mask layer 106b, the isolation structure 105, the S/D features 104. The operation 14 exposes the sidewalls of the gate spacer 108a. The gate spacer 108a provides an upper portion over the sidewalls of the gate stack 106 and a lower portion extending from the upper portion and extending away from the gate stack 106, thereby presenting itself in the shape of the letter "L." The gate spacer 108a may be referred to as having an L-shape in some embodiments. The gate spacer 108a may be partially etched in some embodiments. Yet in some embodiments, the gate spacer 108a may be fully removed from the top of the fin 103, similar to the gate spacer 108b. When the gate spacer 108a is not fully removed from the top of the fin 103, it may have a thickness about 1 nm to about 10 nm on the sidewalls of the gate stack 106.

Figure 4B:
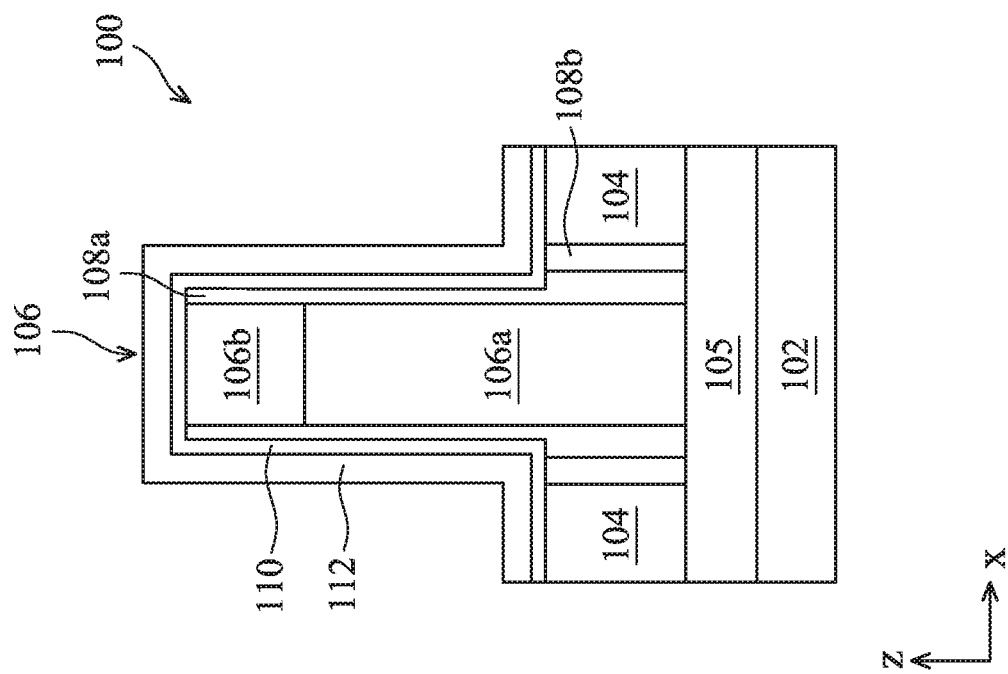
Figure 4A:
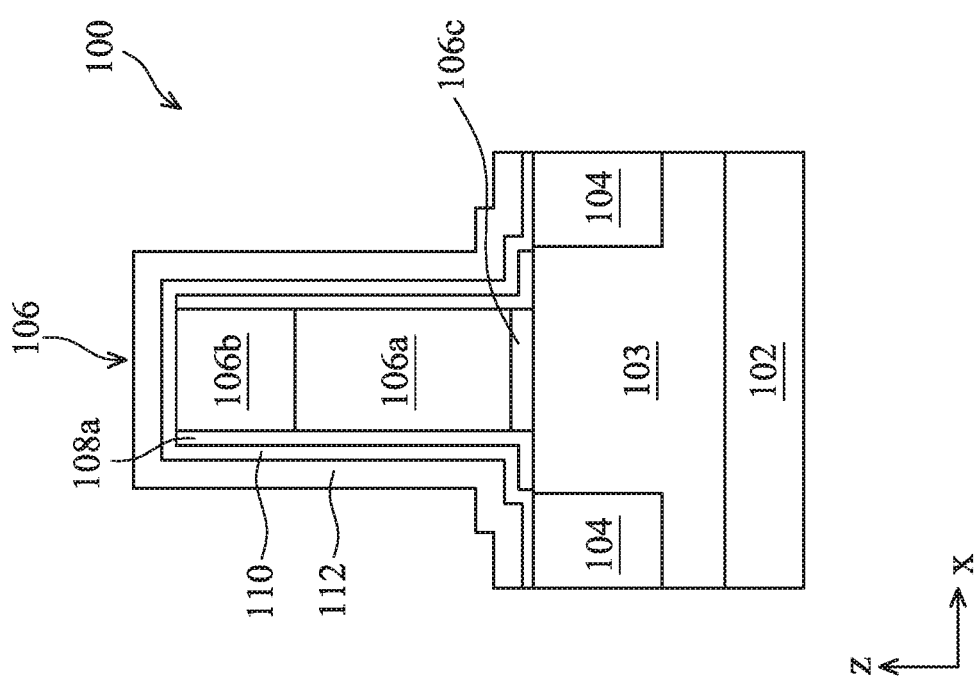

At operation 16, the method 10 (FIG. 1A) deposits another gate spacer 110 over the gate stack 106, any remaining portion of the gate spacer 108a, any remaining portion of the gate spacer 108b, the fin 103, and the S/D features 104, as shown in FIGS. 4A and 4B. In embodiments where the gate spacer 108a is fully removed from the top of the fin 103, the gate spacer 110 is deposited on the sidewalls of the gate stack 106 as well as on the top surface of the fin 103. The gate spacer 110 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s), and may be deposited using ALD, CVD, or other suitable methods. The gate spacer 110 may include the same material as the gate spacer 108a and/or 108b. In an embodiment, the gate spacer 110 is deposited to a substantially uniform thickness, which may be in the range from about 1 nm to about 10 nm. The gate spacer 110 also has an L-shape, with an upper portion over the sidewalls of the gate stack 106 and a lower portion extending from the upper portion and extending away from the gate stack 106. Particularly, the lower portion of the gate spacer 110 has a step when transitioning from the top of the S/D features 104 to the top of the fin 103.

At operation 18, the method 10 (FIG. 1A) deposits a dummy spacer 112 over the gate spacer 110, as shown in FIGS. 4A and 4B. The dummy spacer 112 and the gate spacer 110 include different materials in the present embodiment. In an embodiment, the dummy spacer 112 may be a layer of silicon, silicon germanium, or other suitable material. The dummy spacer 112 may be deposited using ALD, CVD, or other suitable methods. In the present embodiment, the dummy spacer 112 is deposited to a substantially uniform thickness, which may be in the range from about 1 nm to about 10 nm.

At operation 20, the method 10 (FIG. 1A) etches the dummy spacer 112 so that only the portion of the dummy spacer 112 on the upper portion of the L-shaped spacer 110 remains, such as shown in FIGS. 5A and 5B. In an embodiment, this is achieved by applying an anisotropic etching process. Further, the etching process is tuned selective to the materials of the dummy spacer 112, and with no (or little) etching to the spacer 110. As a result, part of the lower portion of the L-shaped spacer 110 is exposed. The portion of the spacer 110 over the S/D features 104 may have a thickness of about 0.5 nm to about 10 nm for example.

Figure 6B:
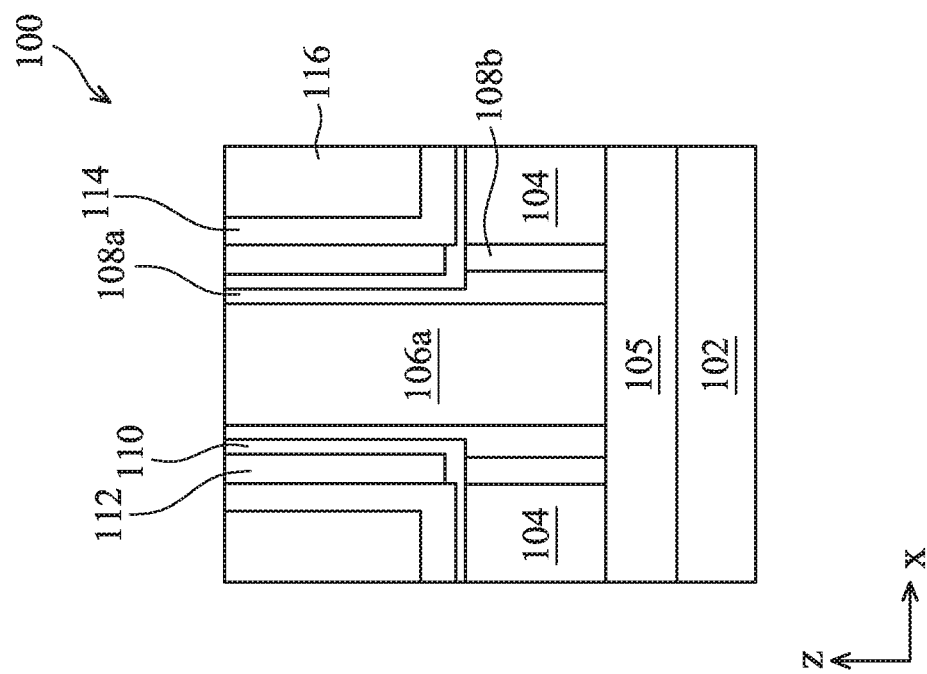
Figure 6A:
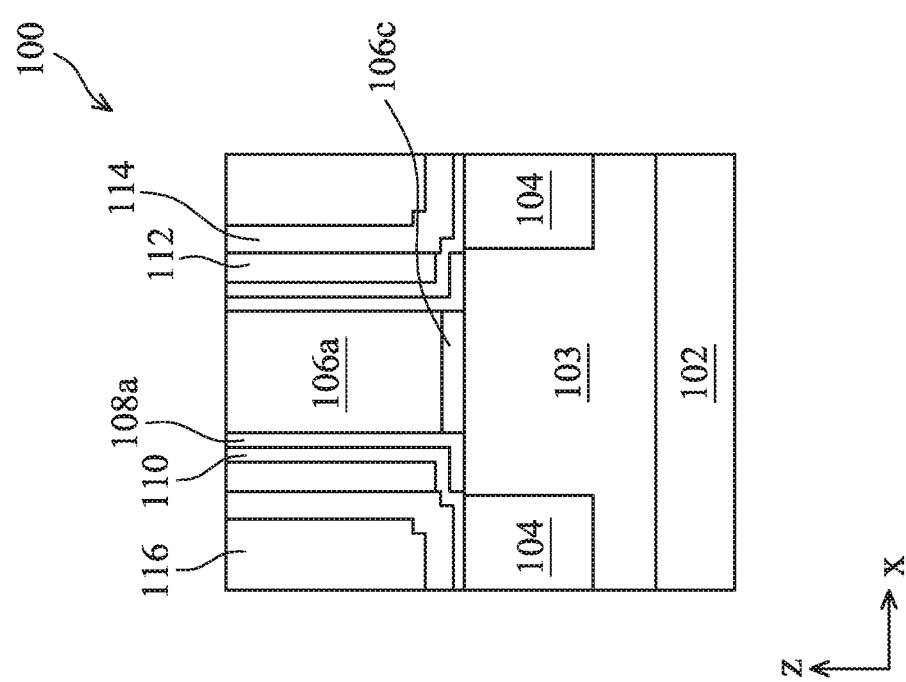

At operation 22, the method 10 (FIG. 1A) forms a contact etch stop layer (CESL) 114 and an inter-level dielectric (ILD) layer 116, as shown in FIGS. 6A and 6B. Particularly, the CESL 114 is disposed over the sidewalls of the dummy spacer 112 and over the lower portion of the L-shaped spacer 110, and the ILD layer 116 is disposed over the CESL 114. Particularly, the dummy spacer 112 is sandwiched between the CESL 114 and the gate spacer 110. The CESL 114 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. In an embodiment, the CESL 114 is deposited to a substantially uniform thickness, which may be in a range of about 1 nm to about 10 nm for example. The ILD layer 116 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The ILD 116 may be formed by PECVD (plasma enhanced CVD), FCVD (flowable CVD), or other suitable methods. Subsequently, the operation 22 performs a chemical-mechanical planarization (CMP) process to the device 100. The CMP process removes the hard mask 106b from the top of the gate stack 106, making the device 100 ready for a gate replacement process.

Figure 7B:
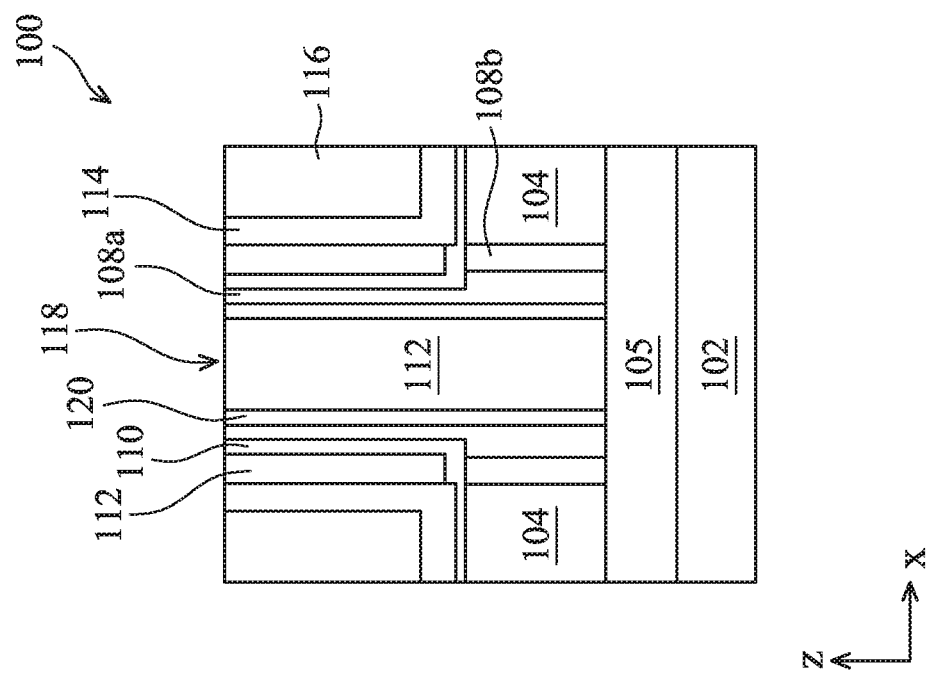
Figure 7A:
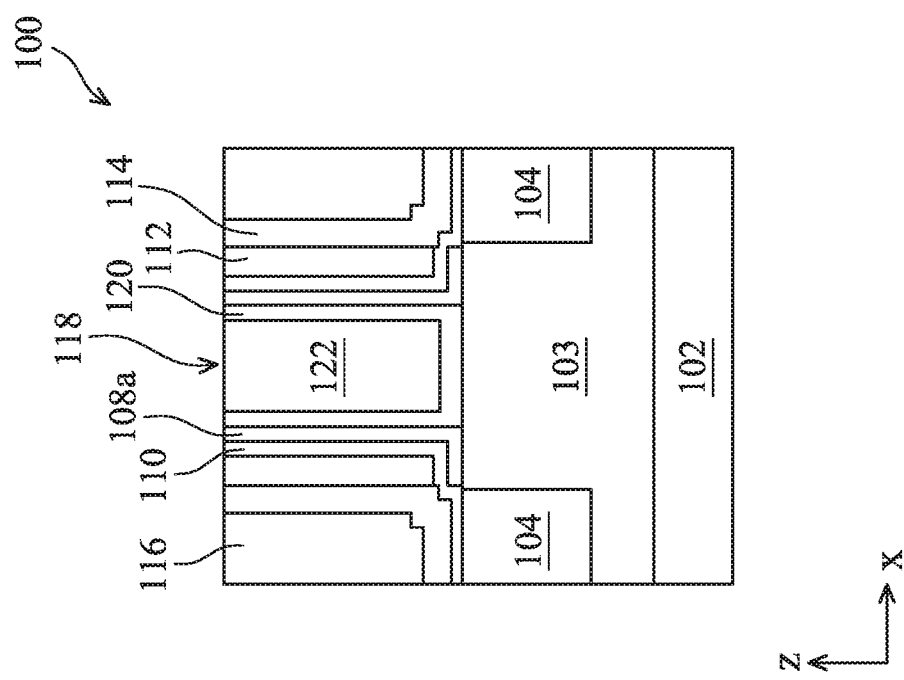

At operation 24, the method 10 (FIG. 1A) replaces the gate stack 106 (which is a dummy or sacrificial gate) with a functional gate stack 118 (which is a high-k metal gate in an embodiment), as shown in FIGS. 7A and 7B. This is referred to as a gate replacement process (or replacement gate process). In an embodiment, the operation 24 performs one or more etching process to remove the sacrificial gate electrode layer 106a and the sacrificial gate dielectric layer 106c. The etching process may include dry etching, wet etching, reactive ion etching, combinations thereof, or other suitable etching processes. The etching process is tuned selective to the materials of the layers 106a and 106c, with no (or minimal) etching to the ILD layer 116, the CESL 114, the dummy spacer 112, the gate spacers 110, 108a, and 108b, and the fin 103. The etching process results in a gate trench between two opposing gate spacers 108a (or between two opposing gate spacers 110 if the gate spacer 108a is removed). The gate trench exposes channel regions of the fin 103. In embodiments where the device 100 includes gate-all-around devices such as nanosheet devices or nanowire devices, the operation 24 may further perform a channel release process within the gate trench where some layers of the fin 103 are removed, leaving semiconductor channel layers suspended between and connecting to the S/D features 104.

After the gate trench is formed (and optionally, semiconductor channel layers are released), the operation 24 deposits a functional gate stack 118 within the gate trench. In an embodiment, the functional gate stack 118 includes a gate dielectric layer 120 and a gate electrode layer 122 over the gate dielectric layer 120. The gate dielectric layer 120 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 120 may be formed by chemical oxidation, thermal oxidation, atomic layer deposition (ALD), chemical vapor deposition (CVD), and/or other suitable methods. In some embodiments, the functional gate stack 118 further includes an interfacial layer between the gate dielectric layer 120 and the fin 103. The interfacial layer may include silicon dioxide, silicon oxynitride, or other suitable materials. In some embodiments, the gate electrode layer 122 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 122 may be formed by CVD, PVD, plating, and/or other suitable processes. Since the functional gate stack 118 includes a high-k dielectric layer and metal layer(s), it is also referred to as a high-k metal gate.

Figure 8B:
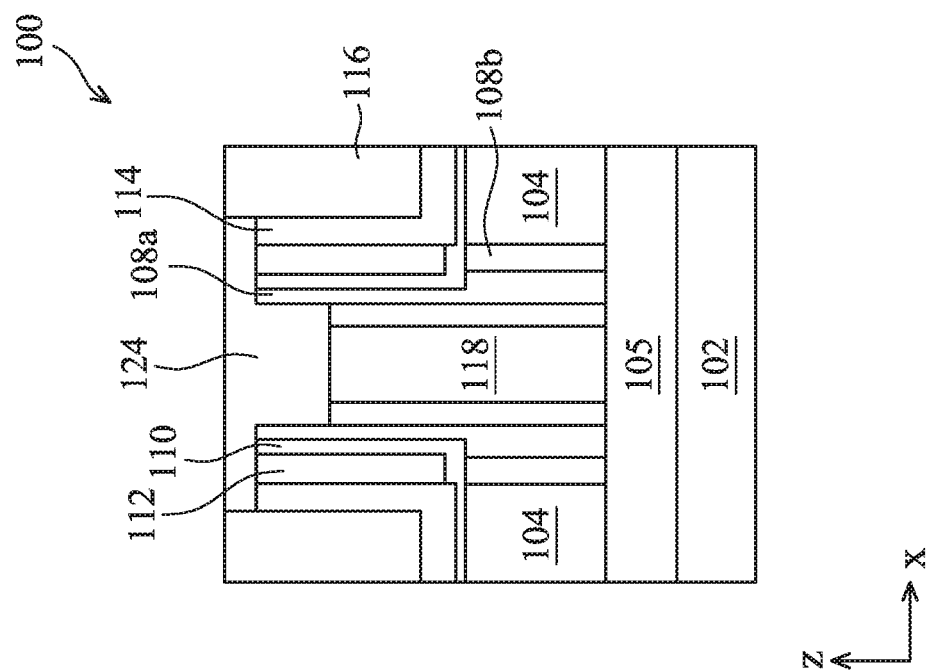
Figure 8A:
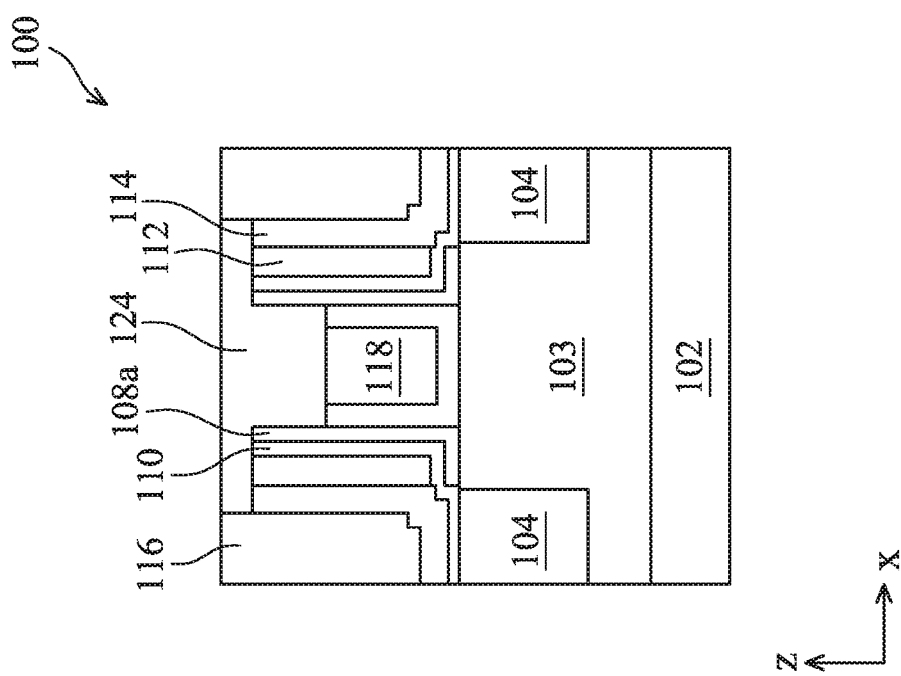

At operation 26, the method 10 (FIG. 1B) forms a gate cap 124 over the gate stack 118. An embodiment is shown in FIGS. 8A and 8B. The gate cap 124 will be removed in a later step. Therefore, it is also referred to as a dummy gate cap 124 or a dummy cap 124. The dummy gate cap 124 may include a material such as Si, SiGe, $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other material(s). The dummy gate cap 124 includes a material that is different from those in the gate stack 118, gate spacers 108a and 110, CESL 114, and ILD 116. The dummy gate cap 124 and the dummy spacer 112 may include the same material or different materials. The dummy gate cap 124 may be formed by recessing the gate stack 118 between the opposing gate spacers 108a (or between the opposing gate spacers 110 if the gate spacers 108a are removed); recessing the layers 114, 112, 110, and 108a; depositing one or more materials over the recessed gate stack 118; and performing a CMP process to the one or more materials. The dummy gate cap 124 may be deposited by atomic layer deposition (ALD), CVD, and/or other suitable methods.

The dummy gate cap 124 may be formed into a T-shape, like the embodiment shown in FIGS. 8A and 8B. As shown, the dummy gate cap 124 has a lower portion above the gate stack 118 and laterally between the gate spacers 108a and an upper portion above the lower portion as well as above the gate spacers 108a and 110, the dummy spacer 112, and the CESL 114. In an embodiment, to form the T-shaped dummy gate cap 124, the operation 26 not only recesses the gate stack 118, but also recesses the gate spacers 108a and 110, the dummy spacer 112, and the CESL 114. Further, it recesses the gate stack 118 deeper than it does to the other layers. The recess produces a T-shaped trench, and the material for the dummy gate cap 124 is subsequently deposited into the T-shaped trench.

Figure 9B:
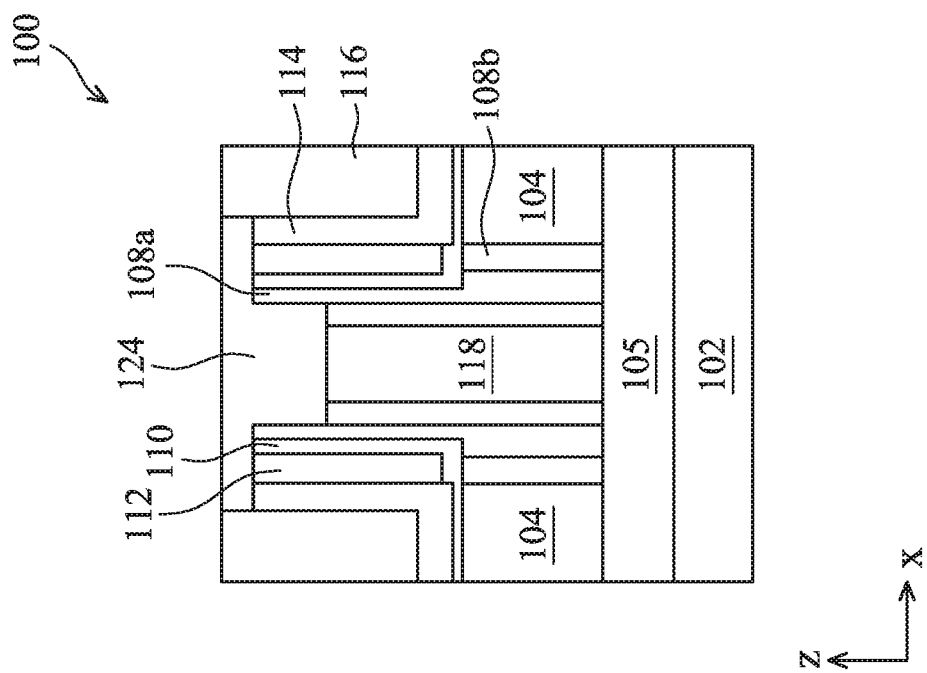
Figure 9A:
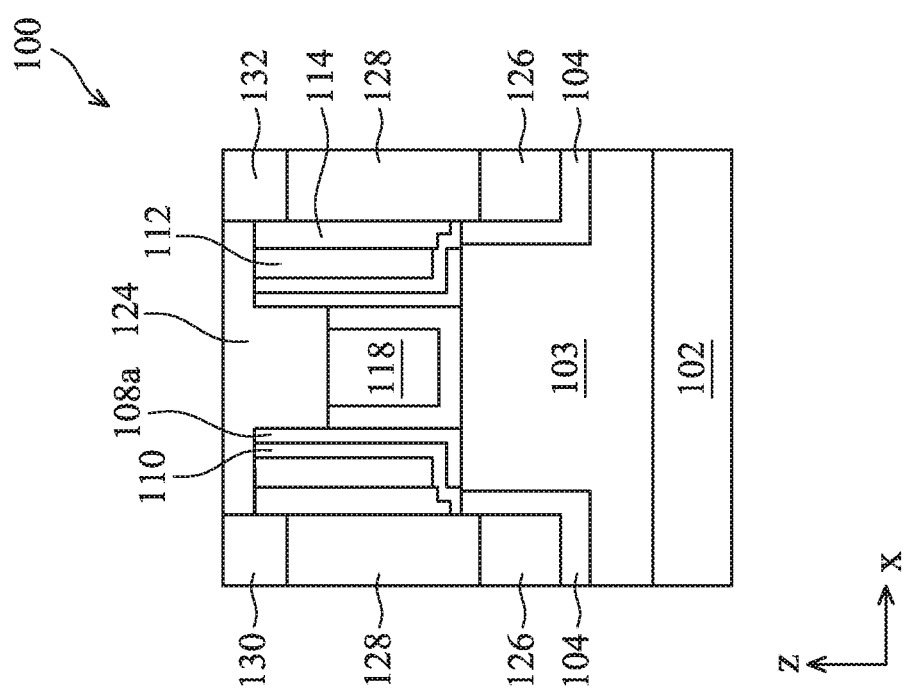
Figure 9D:
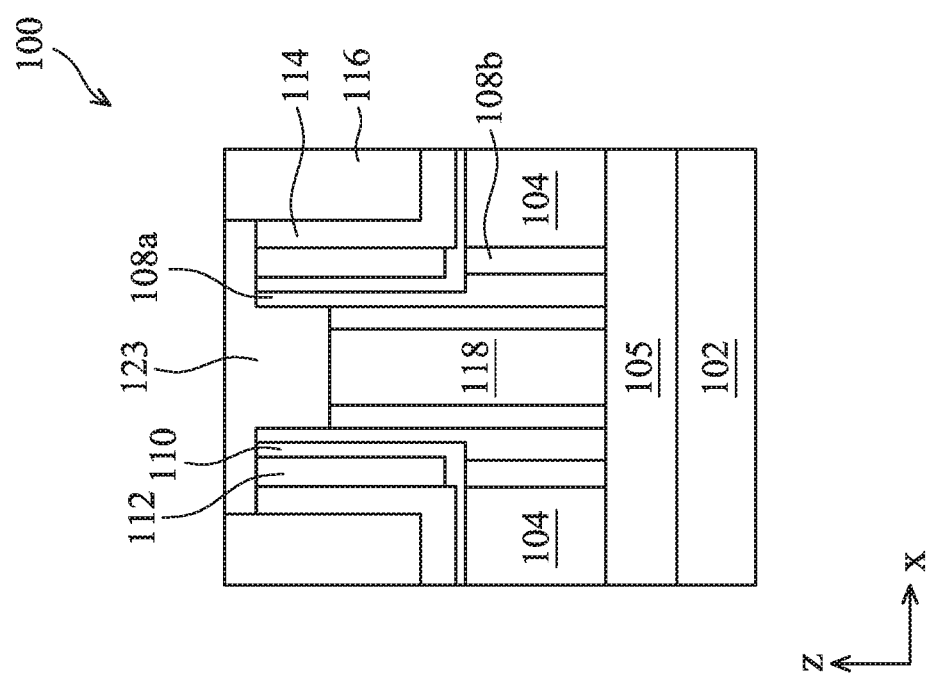
FIGS. 9D and 11D illustrate cross-sectional views of a portion of the semiconductor device along the C-C line in FIGS. 9C and 11C respectively, according to some embodiments.
Figure 9C:
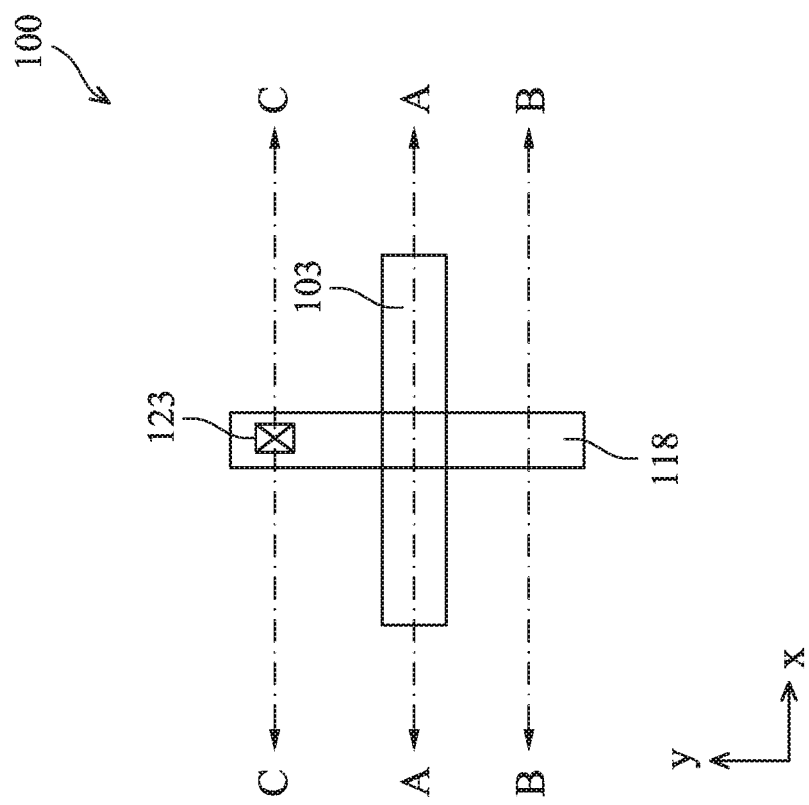
FIGS. 9C and 11C show a simplified schematic top view of a portion of the semiconductor device in FIG. 2A, according to an embodiment.

At operation 28, the method 10 (FIG. 1B) forms conductive features connecting to the S/D features 104, such as shown FIGS. 9A and 9B. In an embodiment, the conductive features include silicide feature 126, S/D contacts 128, and S/D contact via 132. In an embodiment, the operation 28 includes etching contact holes through the ILD layer 116 and the CESL 114 to expose portions of the S/D features 104, and forming the silicide features 126 and S/D contacts 128 in the contact holes. In the present embodiment, the operation 28 further forms a S/D contact cap 130 and forms a S/D contact via 132 through the S/D contact cap 130 and electrically connecting to the S/D contact 128. The operation 28 may also form a gate via 123 connecting to the gate stack 118, such as shown in FIGS. 9C and 9D. FIG. 9C illustrates a simplified schematic top view of the device 100, and FIG. 9D illustrates a cross-sectional view of the device 100 along the C-C line in FIG. 9C. The lines A-A and B-B in FIG. 9C correspond to the A-A and B-B line in FIG. 2A. In an embodiment, the operation 28 includes etching the gate cap 124 through an etch mask to form a hole and depositing the gate via 123 in the hole. The gate via 123 is electrically connected to the gate stack 118.

The silicide features 126 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. The silicide feature 126 may be formed by depositing one or more metals into the contact holes, performing an annealing process to cause reaction between the one or more metals and the S/D features 104 to produce the silicide features 126, and removing un-reacted portions of the one or more metals.

The S/D contacts 128 may include one or more metallic materials such as tungsten (W), cobalt (Co), ruthenium (Ru), other metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes.

The S/D contact cap 130 may be formed by recessing the S/D contacts 128, depositing one or more dielectric materials over the recessed S/D contacts 128, and performing a CMP process to the one or more dielectric materials. The S/D contact cap 130 may include a dielectric material such as $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s), and may be deposited by atomic layer deposition (ALD), CVD, and/or other suitable methods.

The S/D contact via 132 and the gate vias 123 may include one or more conductive materials such as Co, W, Ru, Al, Mo, Ti, TiN, TiSi, CoSi, NiSi, TaN, Ni, TiSiN, or combinations thereof, and may be formed by CVD, PVD, plating, and/or other suitable processes. The S/D contact via 132 penetrates through the S/D contact cap 130 and makes electrical contact with the S/D contact 128.

Figure 10A:
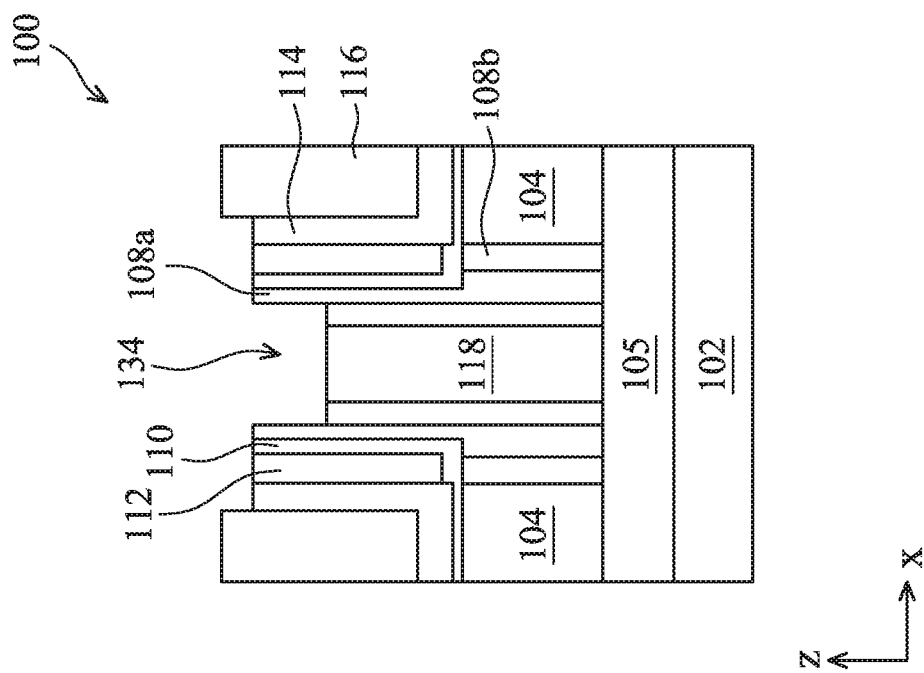
Figure 10B:
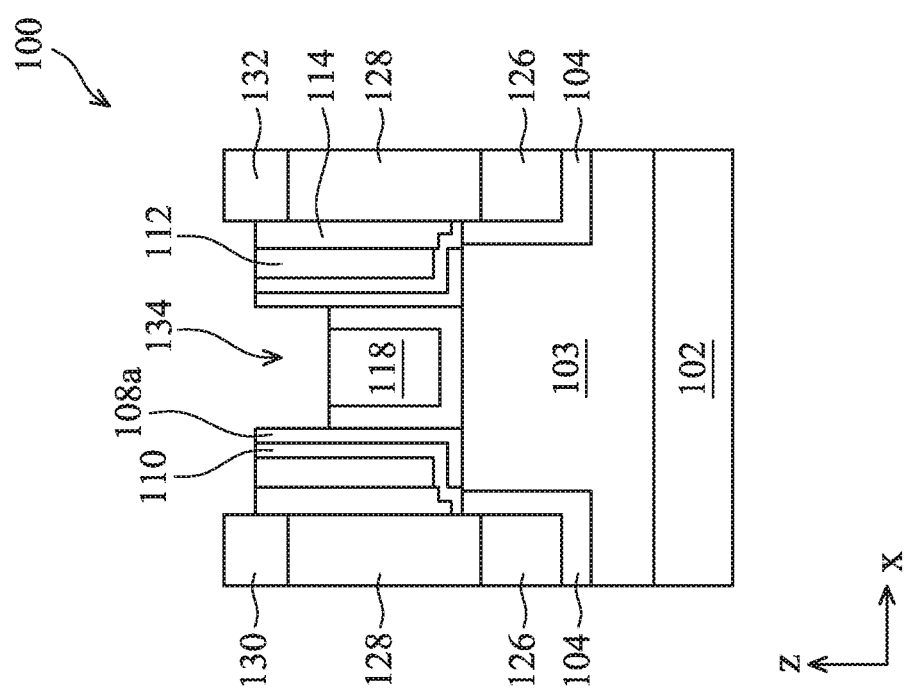

At operation 30, the method 10 (FIG. 1B) removes the dummy gate cap 124, resulting in a void 134 above the gate stack 118, such as shown in FIGS. 10A and 10B. The dummy gate cap 124 may be removed using dry etching, wet etching, reactive ion etching, or other suitable etching methods. In an embodiment, the etching process is tuned selective to the materials of the dummy gate cap 124 and has no (or little) etching to the ILD layer 116, the S/D contact cap 130, the S/D contact via 132, the CESL 114, and the gate spacers 110 and 108a.

Figure 11B:
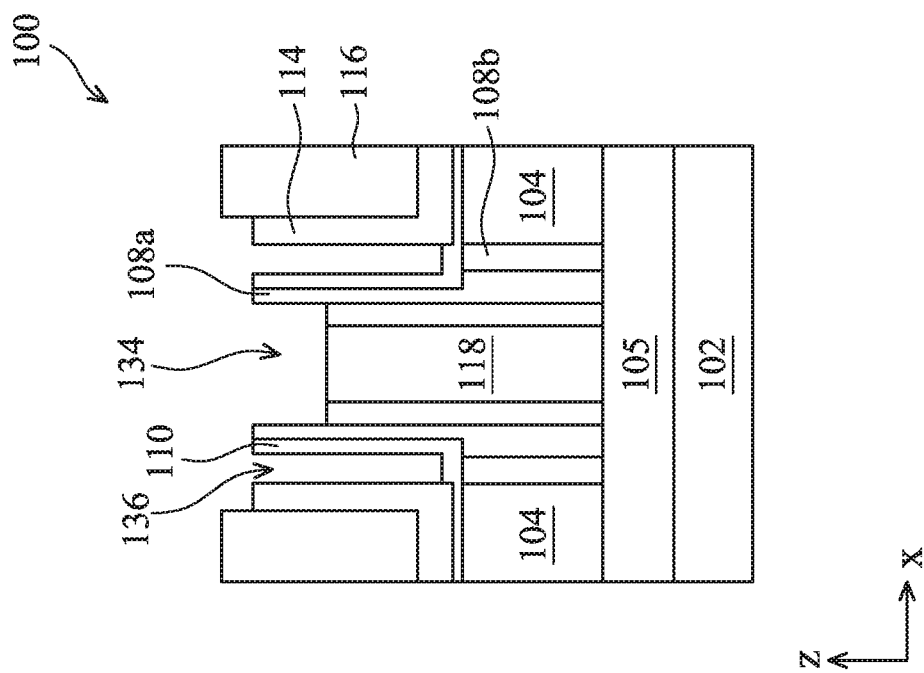
Figure 11A:
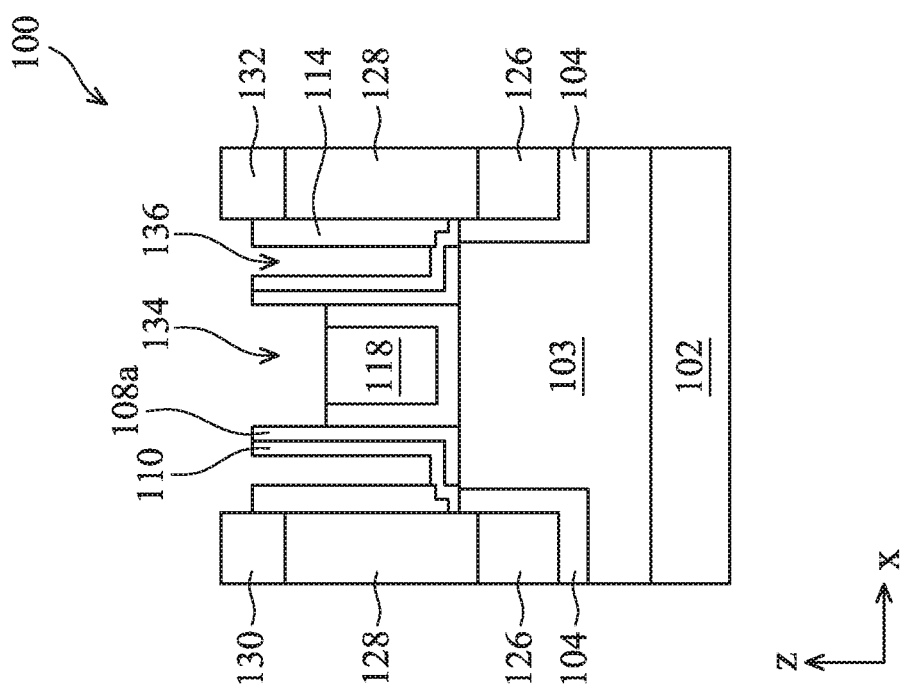
Figure 11D:
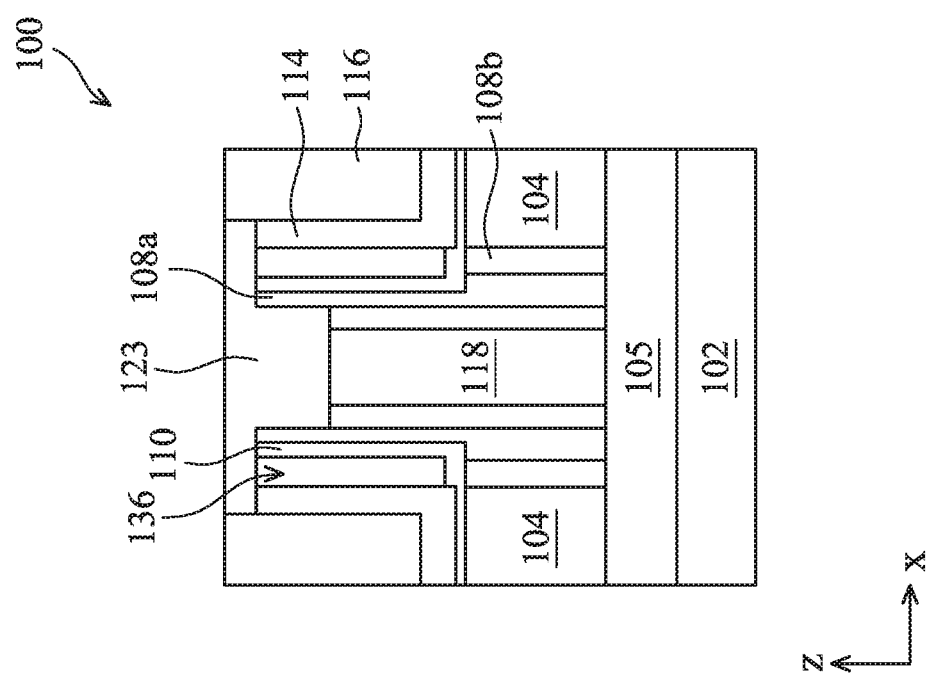
Figure 11C:
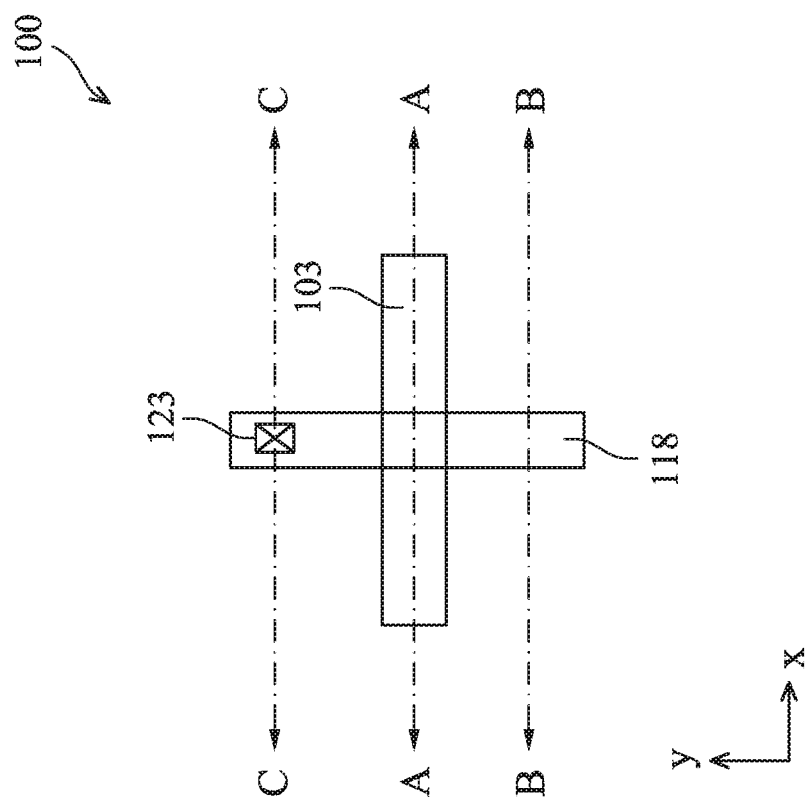

At operation 32, the method 10 (FIG. 1B) removes the dummy spacer 112, resulting in voids 136, such as shown in FIGS. 11A, 11B, 11C, and 11D. Each void 136 is sandwiched between the CESL 114 and the gate spacer 110. Particularly, each void 136 exposes an upper surface of the lower portion of the gate spacer 110, a first sidewall surface of the upper portion of the gate spacer 110 that is distal the gate stack 118, and a sidewall surface of the CESL 114 that faces the first sidewall surface of the upper portion of the gate spacer 110. As illustrated in FIGS. 11C and 11D where FIG. 11D is a cross-sectional view of the device 100 along the C-C line in FIG. 11C, the dummy spacer 112 is also removed from the area under the gate via 123 and the void 136 extends to the area under the gate via 123. The dummy spacer 112 may be removed using dry etching, wet etching, reactive ion etching, or other suitable etching methods. In an embodiment, the etching process is tuned selective to the materials of the dummy spacer 112 and has no (or little) etching to the ILD layer 116, the S/D contact cap 130, the S/D contact via 132, the CESL 114, the gate spacers 110 and 108a, and the gate stack 118. In some embodiments, the dummy gate cap 124 and the dummy spacer 112 may be removed in the same etching process (i.e., the operations 30 and 32 may be performed as one etching process).

Figure 12B:
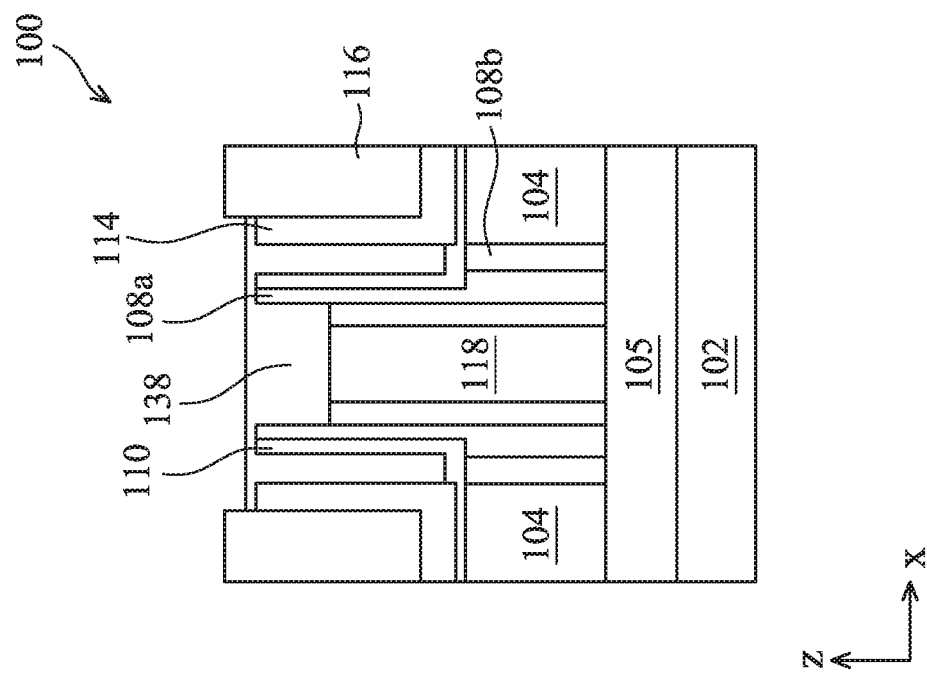
Figure 12A:
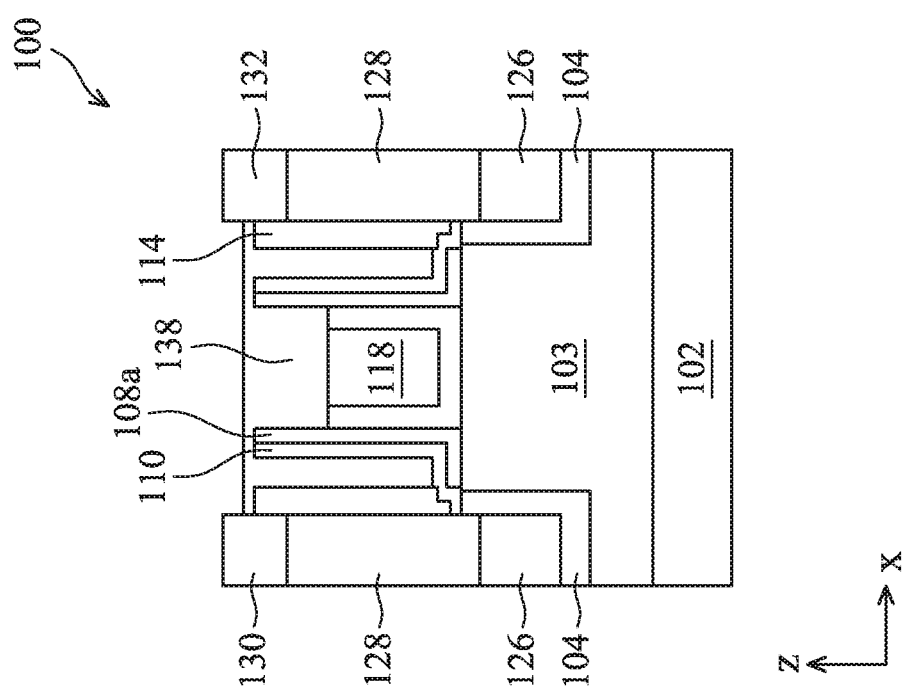
Figure 19B:
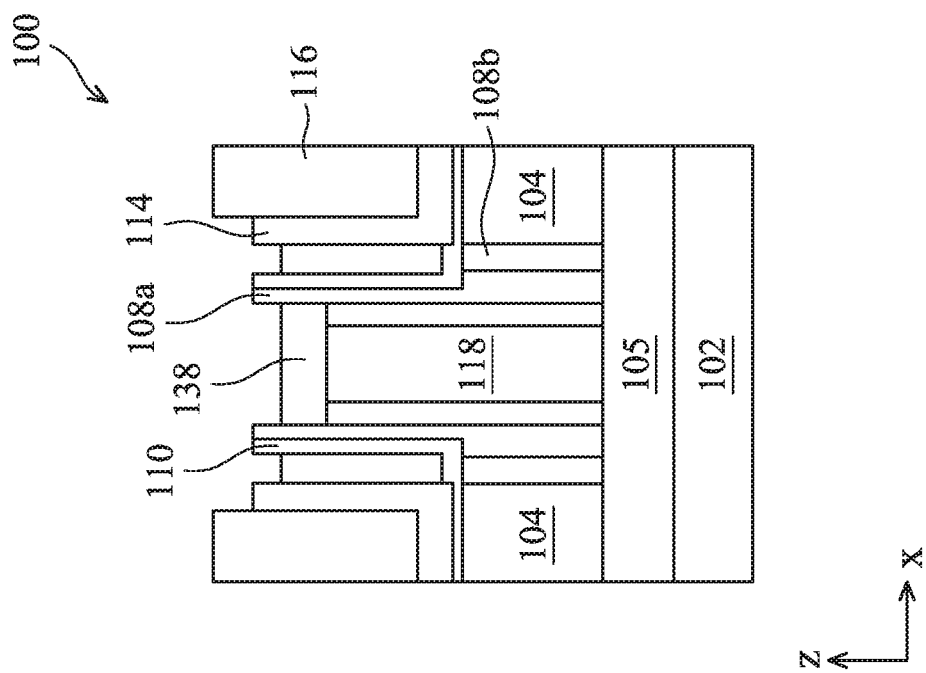
Figure 19A:
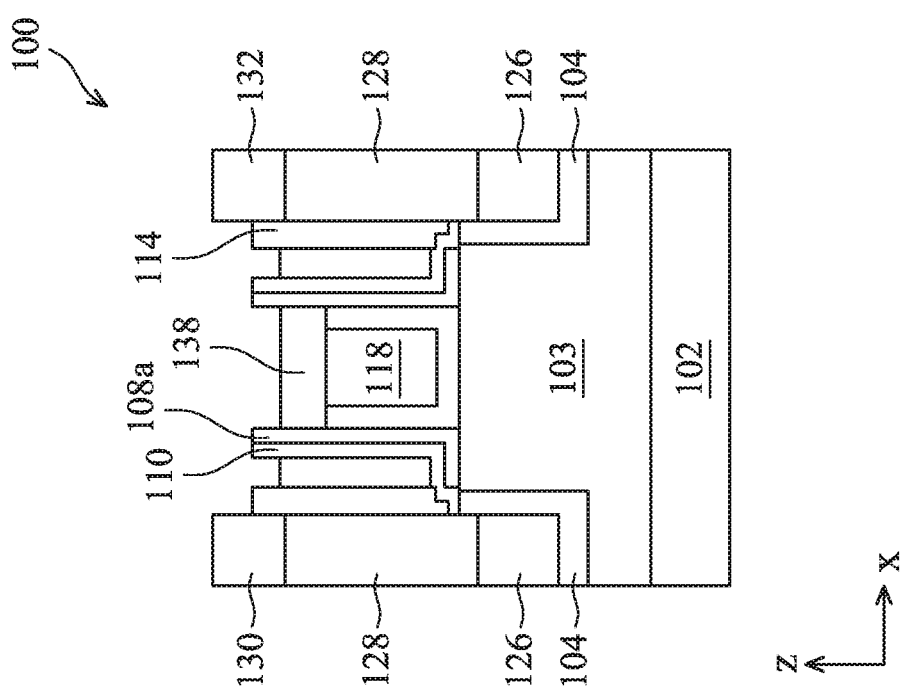
Figure 21B:
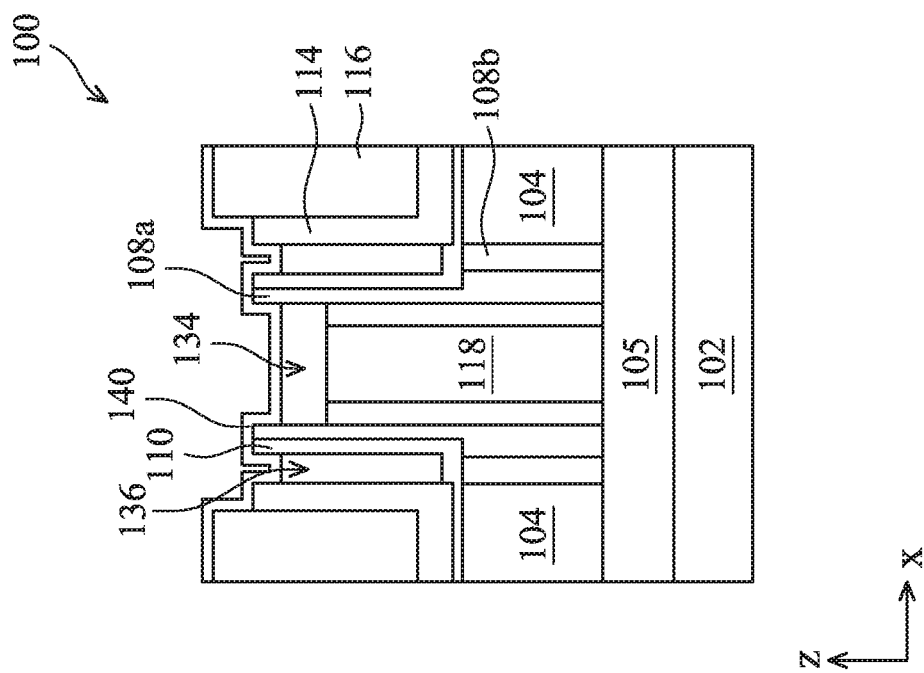
Figure 21A:
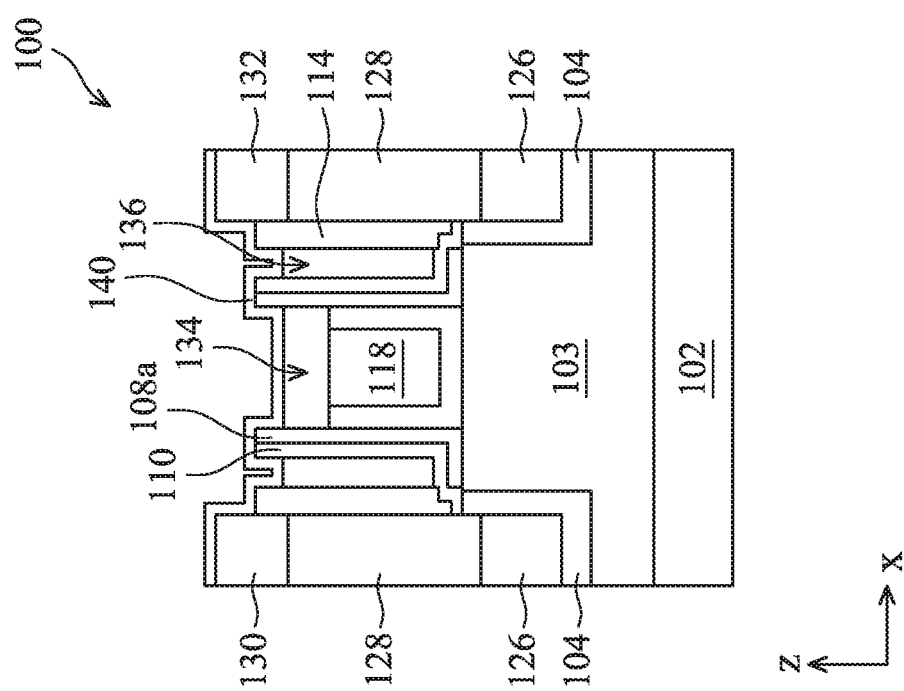
Figure 24:
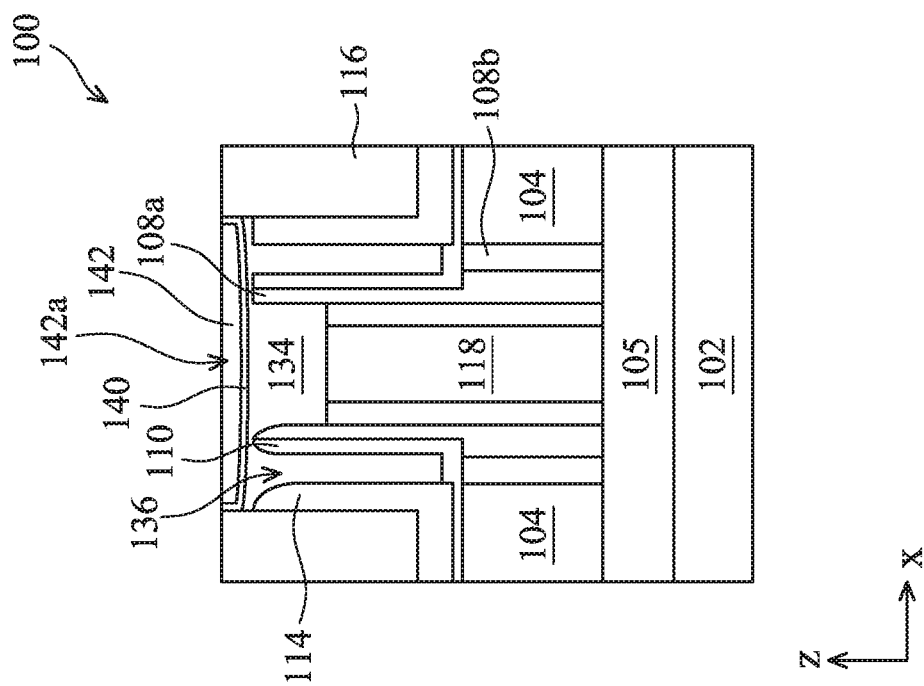
Figure 23:
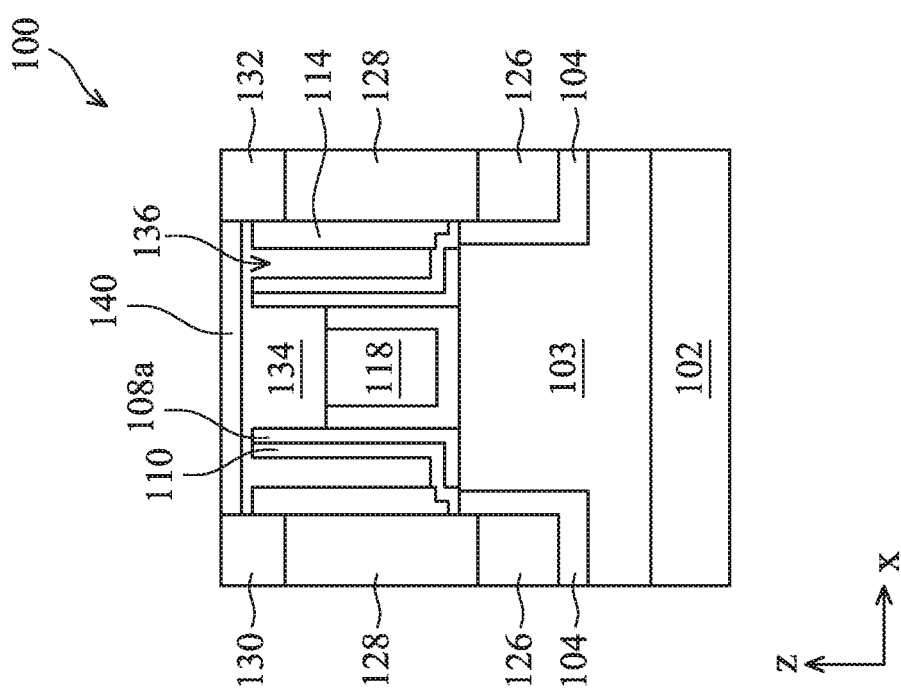
Figure 26:
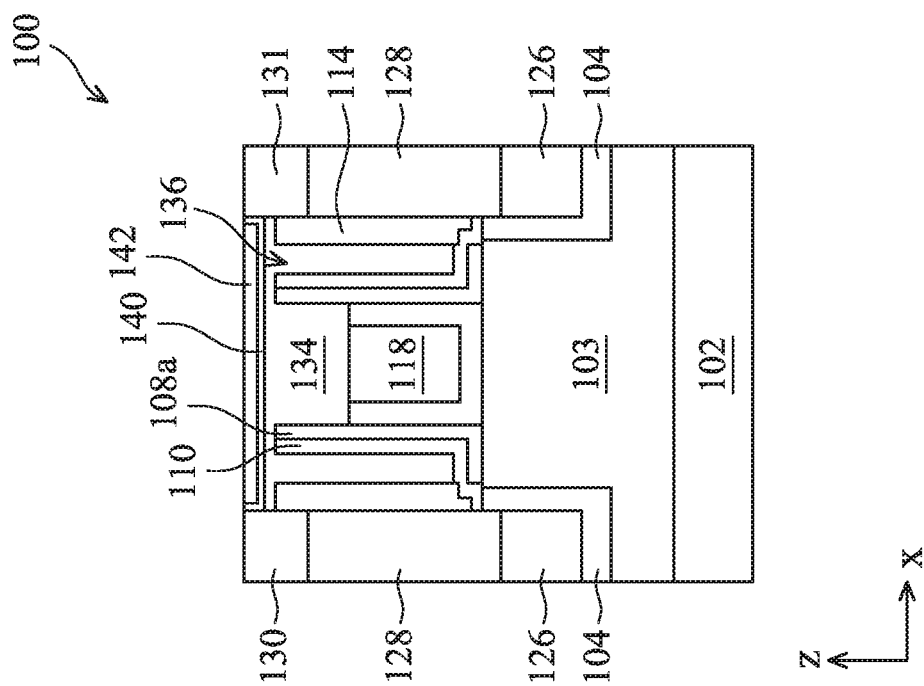
Figure 25:
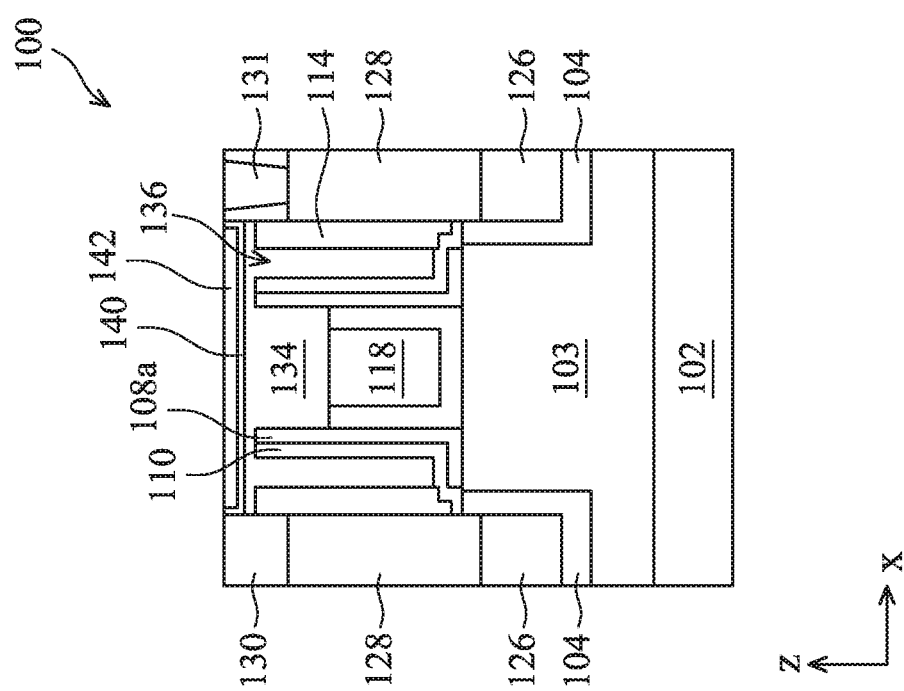

At operation 34, the method 10 (FIG. 1B) deposits a layer 138 of a decomposable material to fill the voids 134 and 136, such as shown in FIGS. 12A and 12B. The layer 138 is also referred to as a decomposable layer 138. In some embodiments, the operation 34 may deposit the decomposable layer 138 over the ILD layer 116, the S/D contact cap 130, and the S/D contact via 132 and perform an etching back process to the decomposable layer 138. After the deposition or after the etching back, a top surface of the decomposable layer 138 is below the top surface of the ILD layer 116, the S/D contact cap 130, and the S/D contact via 132. In some embodiments (such as shown in FIGS. 19A and 19B), the top surface of the decomposable layer 138 is deposited or etched back below the top surface of the CESL 114 and the gate spacers 110 and 108a. In some embodiments, the decomposable layer 138 includes a polymer that can be decomposed under heat, UV irradiation, or some other process conditions. For example, the decomposable layer 138 may include $CF_4$ or $C_4F_6$ polymer. In some embodiments, the decomposable layer 138 may comprise P (neopentul methacrylate-co-ethylene glycol dimethacrylate) copolymer, polypropylene glycol (PPG), polybutadine (PB), polyethylene glycol (PEG), polycaprolactone diol (PCL), or other suitable material. The decomposable layer 138 may be deposited by spin coating, CVD, PECVD, ALD, PEALD, or other deposition techniques. The etching back of the decomposable layer 138 may use anisotropic etching such as plasma dry etching. For example, the etching may use a dry etchant that is based on $N_2$, $H_2$, and/or $O_2$.

Figure 13B:
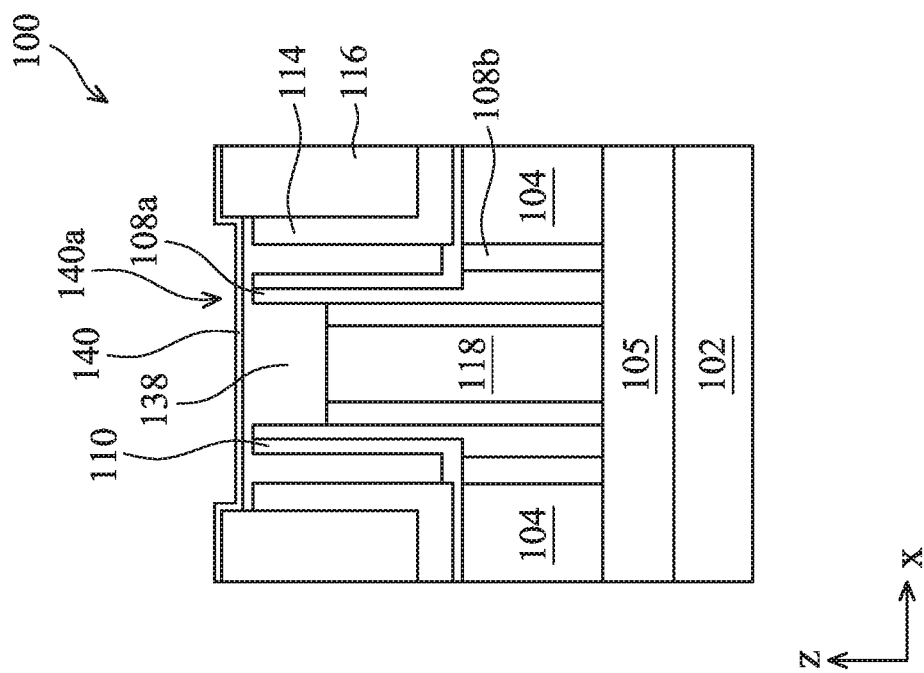
Figure 13A:
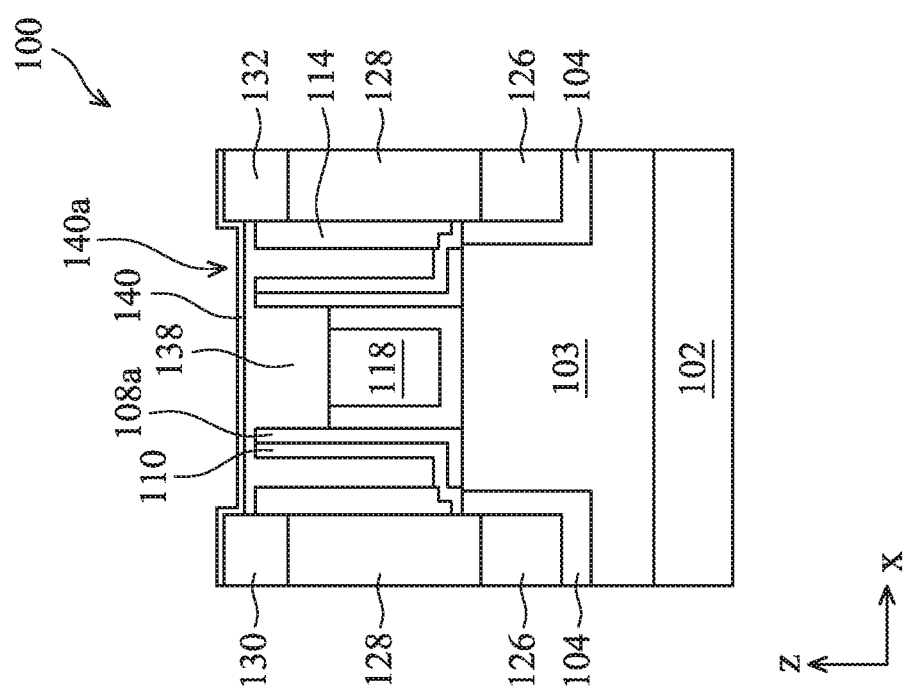

At operation 36, the method 10 (FIG. 1B) forms a seal layer 140 over the decomposable layer 138, the ILD layer 116, the S/D contact cap 130, and the S/D contact via 132, such as shown in FIGS. 13A and 13B. In various embodiments, the seal layer 140 is deposited to a substantially uniform thickness. Further, the thickness of the seal layer 140 is controlled to be in a range of about 0.5 nm to about 30 nm. If the seal layer 140 is too thick (e.g., greater than 30 nm), the decomposable layer 138 may not be effectively removed from under the seal layer 140 in subsequent processes. If the seal layer 140 is too thin (e.g., thinner than 0.5 nm), it may not "seal" well the air gap that is going to be created under the seal layer 140. In various embodiments, the seal layer 140 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s), and may be deposited by ALD, CVD, and/or other suitable methods. In some embodiments, the seal layer 140 is tuned to be porous (having pores therethrough), for example, by adding impurities into the seal layer 140. The pores provide channels for decomposed materials of the layer 138 to escape. Further, in the present embodiment, a first top surface of the seal layer 140 above the ILD layer 116, the S/D contact cap 130, and the S/D contact via 132 is higher than a second top surface of the seal layer 140 above the decomposable layer 138, creating a dip 140a in the seal layer 140 directly above the decomposable layer 138.

Figure 14B:
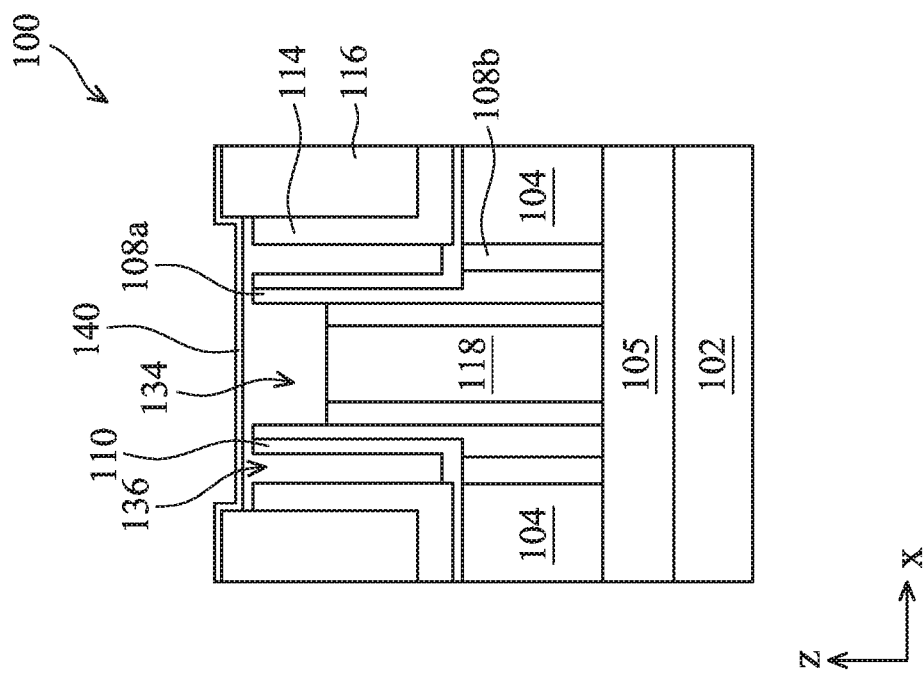
Figure 14A:
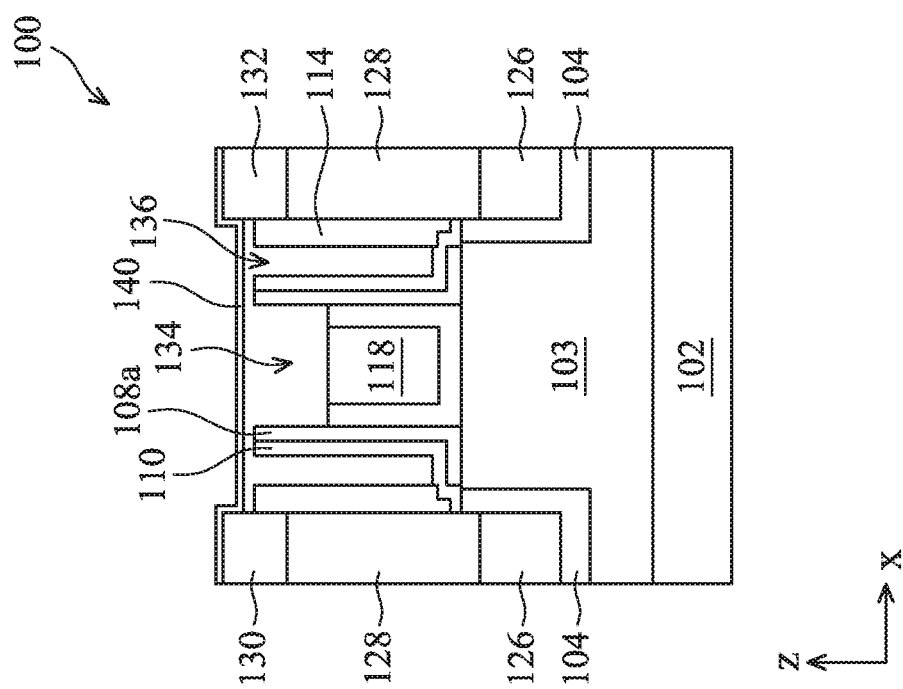
Figure 15B:
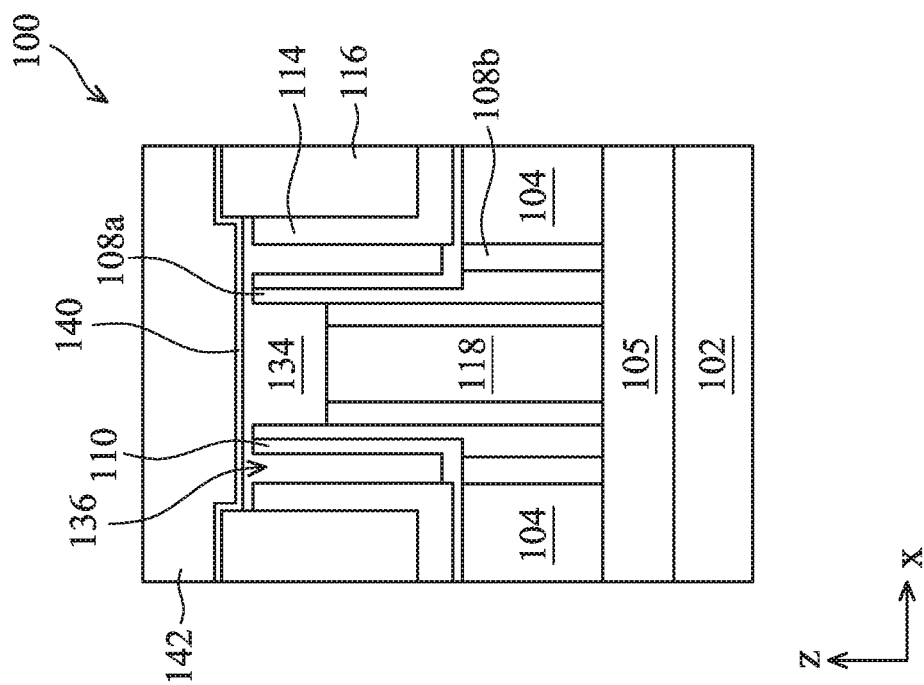
Figure 15A:
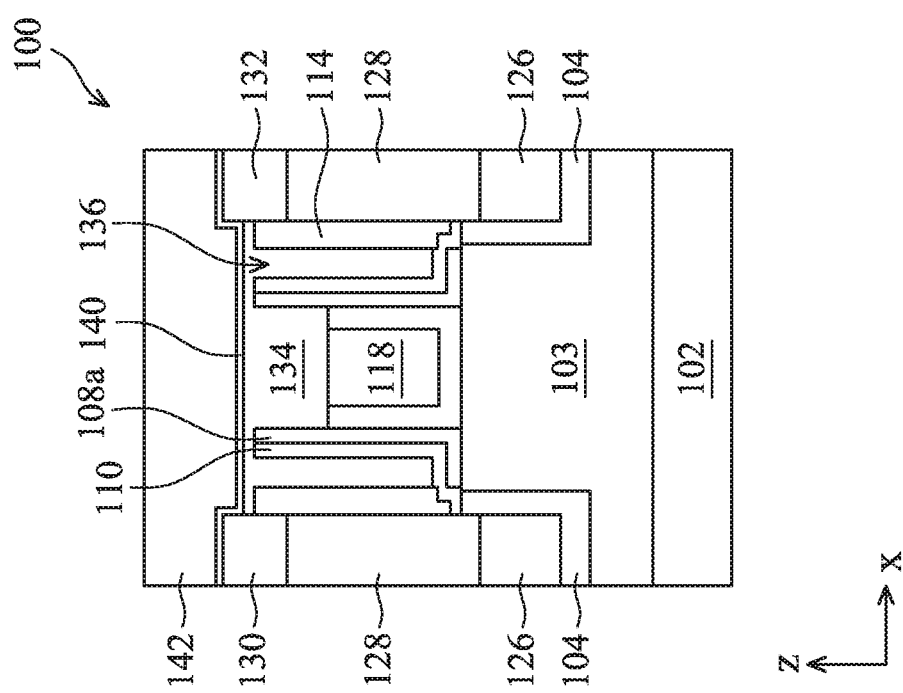

At operation 38, the method 10 (FIG. 1B) removes the decomposable layer 138. In an embodiment, the operation 38 includes exposing the device 100 to UV lights or a thermal process (e.g., heating the device 100 to an elevated temperature) such that the decomposable layer 138 decomposes and turns into a vapor. The vapor molecules are small enough to diffuse through the pores of the seal layer 140. The process condition for the operation 38 depends on the material selection of the decomposable layer 138. For most polymers, a temperature under 400° C. is sufficient to decompose the polymers into small molecules. In various embodiments, the operation 38 may heat the device 100 to a temperature in a range of 100° C. to 400° C. such as from 150° C. to 350° C. These temperature ranges are low enough to maintain the integrity of the various metallic features in the device 100. After the decomposable layer 138 is removed, the device 100 is provided with voids 134 and 136 below the seal layer 140, such as shown in FIGS. 14A and 14B. In essence, the operation 138 reclaims the voids 134 and 136 or portions thereof.

At operation 40, the method 10 (FIG. 1B) deposits another seal layer 142 over the seal layer 140. In the present embodiment, the seal layer 142 is deposited to a thickness greater than the seal layer 140. Particularly, the seal layer 142 fills the dip 140a (see FIGS. 13A and 13B) and overflows above the ILD layer 116, the S/D contact cap 130, and the S/D contact via 132. In various embodiments, the seal layer 142 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s), and may be deposited by CVD or other suitable methods. In some embodiments, to assist in the removal of the decomposable layer 138, the seal layer 140 is designed to be thin and porous. The thin and porous seal layer 140 may not seal the voids 134 and 136 very well and/or may not provide enough mechanical support for layers above (such as metal interconnect layers). In those embodiments, the seal layer 142 is deposited to strengthen the seal layer 140.

Figure 16B:
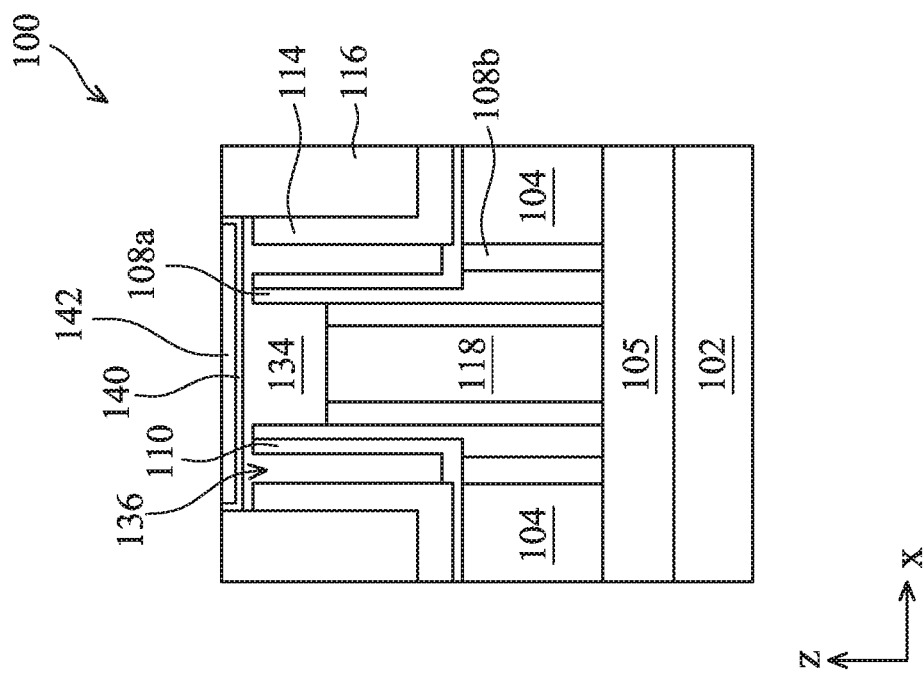
Figure 16A:
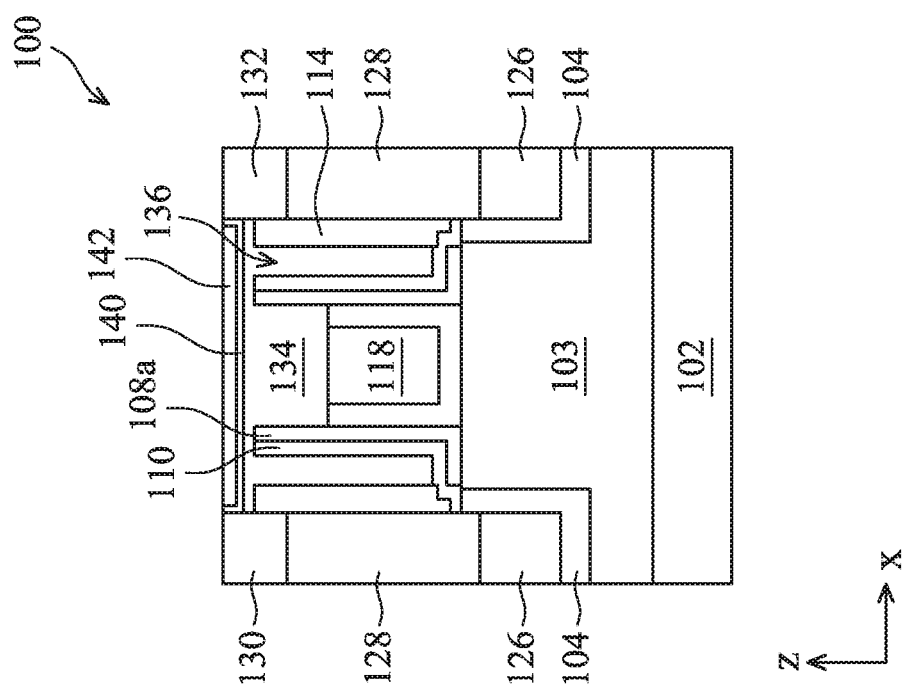

At operation 42, the method 10 (FIG. 1B) performs a CMP process to the seal layers 140 and 142, thereby removing portions of them from the areas above the ILD layer 116, the S/D contact cap 130, and the S/D contact via 132. The CMP process may also partially remove the ILD layer 116, the S/D contact cap 130, and the S/D contact via 132. An embodiment of the resultant device 100 is shown in FIGS. 16A and 16B. In the cross-sectional view along the C-C line in FIG. 11C (i.e., in the area where the gate via 123 is located), the structure of the device 100 remains the same as that in FIG. 11D although the gate via 123 may also be partially removed by the CMP process.

Referring to FIGS. 16A and 16B, the seal layer 142 is disposed in the dip 140a of the seal layer 140. The top surfaces of the seal layers 140 and 142 are substantially co-planar with the top surface of the ILD layer 116, the S/D contact cap 130, and the S/D contact via 132. The void (or air gap) 134 is provided above the gate stack 118. The voids (air gaps) 136 are provided between the CESL 114 and the gate spacers 110. The seal layer 140 is spaced from the CESL 114, the gate spacers 110 and 108a, and the gate stack 118, providing a channel connecting the voids 134 and 136. Because the voids 136 space the gate stack 118 from the CESL 114 and the S/D contacts 128, they are also referred to as air gate spacers 136. The air gate spacers 136 effectively reduce the stray capacitance between the gate stack 118 and the nearby conductors including the S/D features 104, the silicide features 126, the S/D contacts 128, and the S/D contact vias 132. Because the void 134 is above the gate stack 118 and spaces the gate stack 118 from any conductors there above (such as the conductor 144 in FIG. 17), it is also referred to as air gate cap 134. The air gate cap 134 effectively reduces the stray capacitance between the gate stack 118 and any conductors above. Further, the air gate spacers 136 and air gate cap 134 also reduce or eliminate metal leakage to and from the gate stack 118. This greatly increases the operation reliability of the device 100 over time.

In various embodiments, the seal layer 142 may have a thickness about 0.5 nm to about 30 nm to provide mechanical support for any layers deposited there on. Having the seal layer 142 too thick (e.g., greater than 30 nm) may hinder device integration. In various embodiments, the seal layer 140 may have a thickness at its bottom portion about 0.5 nm to about 30 nm (along the "z" direction) and have a thickness at its sidewall portion about 0.5 nm to about 30 nm (along the "x" direction). The significance of these thicknesses has been discussed above. The material of the seal layer 140 and the material of the seal layer 142 may be the same or different in various embodiments. The thickness of the S/D contact cap 130 (along the "z" direction) may be in a range of about 1 nm to about 50 nm in various embodiments. If the S/D contact cap 130 is too thin (e.g., less than 1 nm), then the S/D contacts 128 would be tall, which increases the coupling capacitance between the S/D contacts 128 and the metal gate 118. If the S/D contact cap 130 is too thick (e.g., greater than 50 nm), then the S/D contact via 132 would be long, which increases the source/drain resistance. The thickness of the CESL 114 (along the "x" direction) may be in a range of about 1 nm to about 10 nm in various embodiments. If the CESL 114 is too thin (e.g., less than 1 nm), the coupling capacitance between the S/D contacts 128 and the metal gate 118 would be increased. If the CESL 114 is too thick (e.g., greater than 10 nm), device integration would be hindered. The width of the void 136 (along the "x" direction) may be in a range of about 1 nm to about 10 nm in various embodiments. If the void 136 is too thin (e.g., less than 1 nm), it may not provide effective reduction in the gate's stray capacitance. The maximum width of the void 136 is limited by the width of the fin 103 relative to the width of the gate stack 118. The height of the void 136 (from the upper surface of the lower portion of the gate spacer 110 to the bottom surface of the seal layer 140 along the "z" direction) is in a range of about 1 nm to about 50 nm in various embodiments. Generally, the larger this height, the better device performance. But it is also limited by device integration and device miniaturization. In various embodiments, the upper portion of the gate spacer 110 has a thickness (along the "x" direction) in a range of about 1 nm to about 10 nm, and the lower portion of the gate spacer 110 has a thickness (along the "z" direction) in a range of about 1 nm to about 10 nm. If the gate spacer 110 is too thin (e.g., less than 1 nm) along the "x" direction, the coupling capacitance between the S/D contacts 128 and the metal gate 118 would be increased. If the gate spacer 110 is too thick (e.g., greater than 10 nm) along the "x" direction, device integration would be hindered. If the gate spacer 110 is too thick (e.g., greater than 10 nm) along the "z" direction, it would less room for the voids 136 and decrease device performance. Further, portions of the lower portion of the gate spacer 110 may be disposed under the CESL and may be in a step profile. Those portions of lower portion of the gate spacer 110 may have a thickness (along the "z" direction) in a range of about 0.5 nm to about 10 nm. In various embodiments, the height of the void 134 (from the upper surface of the gate stack 118 to the bottom surface of the seal layer 140 along the "z" direction) is in a range of about 1 nm to about 10 nm. Generally, the larger this height, the better device performance due to lower coupling capacitance between the metal gate 118 and the metal layers above it. But it is also limited by device integration and device miniaturization. In various embodiments, the height of the gap between the bottom surface of the seal layer 140 and the top surface of the layers 114, 110, and 108a is in a range of about 0.5 nm to about 10 nm. Generally, if this gap is too large (e.g., greater than 10 nm), the seal layer 140 might collapse. In various embodiments, the heights of the gap between the bottom surface of the seal layer 140 and the top surface of the layers 114, 110, and 108a, respectively, could be the same or different. Also, the materials for the layers 130, 114, 110, and 108a could be the same or different.

Figure 17:
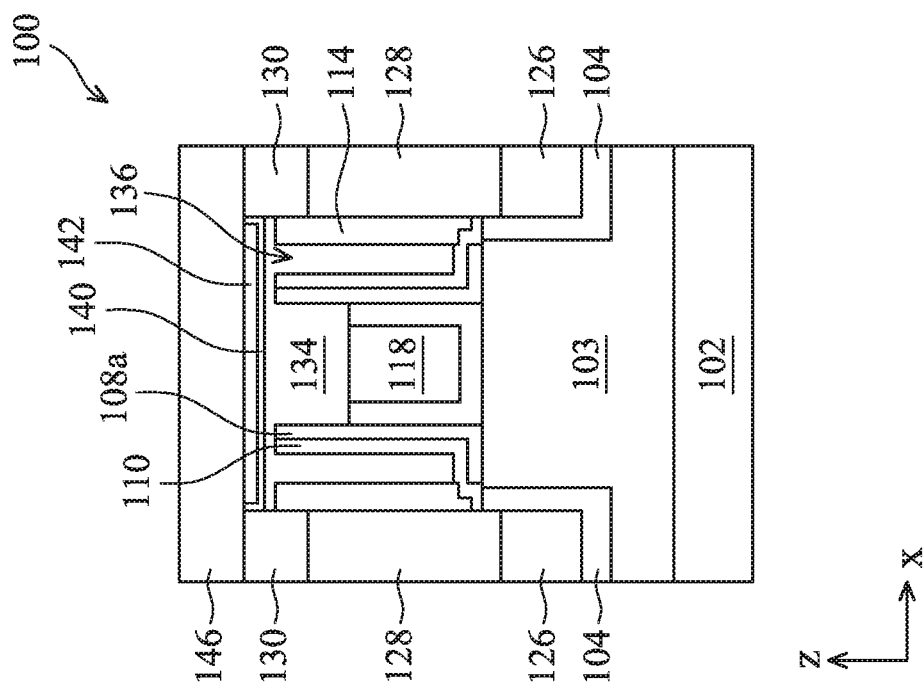
Figure 18:
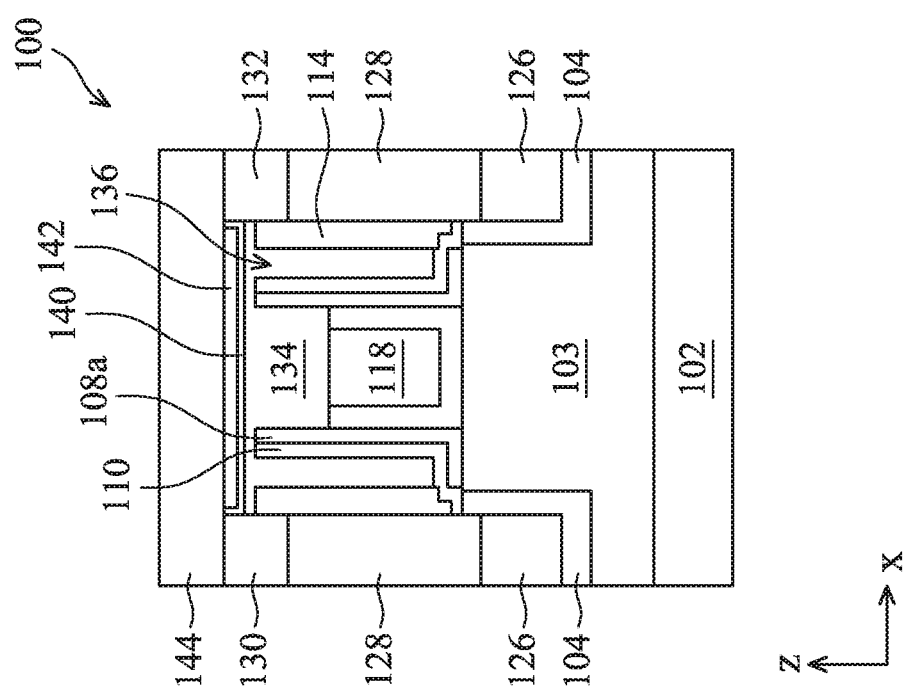

At operation 44, the method 10 (FIG. 1B) performs further fabrication to the device 100. For example, it may deposit one or more ILD layers over the seal layers 140 and 142, and form metal lines and metal vias in the one or more ILD layers. The one or more ILD layers, the metal lines, and the metal vias may be part of a multi-layer interconnect layer. FIG. 17 illustrates an embodiment of the device 100 where a metal feature 144 is deposited over and in contact with the S/D contact via 132. The metal feature 144 is also disposed over the seal layers 140 and 142. The air gate cap 134 effectively reduces the stray capacitance between the gate stack 118 and the metal feature 144 and eliminates metal diffusion between them. The metal feature 144 may include copper, aluminum, tungsten, cobalt, ruthenium, a metal nitride (e.g., TiN, TaN, or WN), or other suitable materials. The metal feature 144 may be formed using damascene, dual damascene, or other processes. FIG. 18 illustrates another embodiment of the device 100 where a dielectric layer 146 is deposited over and in contact with the S/D contact cap 130. The dielectric layer 146 is also disposed over the seal layers 140 and 142. In some embodiments, the dielectric layer 146 may include $La_2O_3$, $Al_2O_3$, SiOCN, SiOC, SiCN, $SiO_2$, SiC, ZnO, ZrN, ZrAlO, $Ta_2O_5$, $ZrO_2$, $HfO_2$, $Si_3N_4$, $Y_2O_3$, AlON, TaCN, SiON, or other suitable materials. The dielectric layer 146 may also comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer 146 may be formed by CVD, PECVD (plasma enhanced CVD), FCVD (flowable CVD), or other suitable methods.

FIGS. 19A through 22B illustrate cross-sectional views of an alternative embodiment of the device 100 fabricated according to an alternative embodiment of the method 10. Referring to FIGS. 19A and 19B, the decomposable layer 138 is deposited and/or recessed such that its top surface is below the top surface of the CESL 114 and the gate spacers 110 and 108a in the operation 34. In some embodiments, the top surface of the decomposable layer 138 is below the top surface of the CESL 114 and the gate spacers 110 and 108a by about 0.1 nm to about 10 nm for example. Referring to FIGS. 20A and 20B, the seal layer 140 is deposited over various surfaces of the layers 130, 132, 116, 114, 110, 108a, and 118 in the operation 36. Particularly, the seal layer 140 is deposited over top surface and some sidewall surfaces of the layers 130, 132, 116, 114, 110, and 108a. Referring to FIGS. 21A and 21B, the decomposable layer 138 is removed, completely or partially, from the device 100 in the operation 38. Referring to FIGS. 22A and 22B, the seal layer 142 is deposited over the seal layer 140 in the operation 40 and the seal layers 140 and 142 are planarized in the operation 42. The seal layer 142 is also deposited laterally between the CESL 114 and the gate spacer 110. The voids 136 are surrounded by the layers 140, 114, and 110. The void 134 is provided above the gate stack 118, laterally between the gate spacers 108a and below the seal layer 140. Further, the voids 136 and 134 are not connected.

FIGS. 23, 24, 25, and 26 illustrate cross-sectional views of alternative embodiments of the device 100 fabricated according to alternative embodiments of the method 10. In the embodiment depicted in FIG. 23, the device 100 does not include the seal layer 142, and the operation 40 is omitted in the method 10. Instead, the seal layer 140 is formed without the dip 140a (see FIG. 13A for an example of the dip 140a). The top surface of the seal layer 140 is substantially co-planar with the top surface of the layers 130, 132, and 116. In the embodiment depicted in FIG. 24, the dip 140a is formed into a bowl shape (a curvy shape). Further, the top corners of the CESL 114 and the gate spacers 110 and 108a may be rounded, as a result of the various etching processes discussed above that may apply to these layers. In some embodiments, the rounded corner of the spacer 108a may have a height (i.e., from its tip to the bottom of the rounded corner, along the "z" direction) in a range of about 0.5 nm to about 30 nm. In some embodiments, the rounded corner of the spacer 110 may have a height (i.e., from its tip to the bottom of the rounded corner, along the "z" direction) in a range of about 0.5 nm to about 30 nm. In some embodiments, the rounded corner of the CESL 114 may have a height (i.e., from its tip to the bottom of the rounded corner, along the "z" direction) in a range of about 0.5 nm to about 30 nm. In some embodiments, there may be voids 142a in the seal layer 142. The voids 142a may have a size (dimension along the "x" direction or the "z" direction) about 0.5 nm to about 30 nm. Generally, if the voids 142a is too big (e.g., greater than 30 nm), the slurry from the CMP process might get stuck in it, which is undesirable. In some embodiments, the top surface of the seal layer 142 may have local dip near its edges where it interfaces with the seal layer 140. This may be produced by the CMP process. In some embodiments, the dip is about 0.5 nm to about 30 nm along the "z" direction. In the embodiment depicted in FIG. 25, the seal layer 140 does not directly contact the S/D contact via 131. Instead, it directly contacts the S/D contact cap 130. In the embodiment depicted in FIG. 26, the CESL 114 is not recessed when forming the gate cap 134 in the operation 26. As a result, the seal layers 140 and 142 are disposed between two opposing sidewalls of the CESL 114, and the CESL 114 laterally separates the seal layers 140 and 142 from the layers 130 and 132.

It is noted that features in the above embodiments of the device 100 may be combined to produce variants (or other embodiments) of the device 100.

Although not intended to be limiting, embodiments of the present disclosure provide one or more of the following advantages. For example, embodiments of the present disclosure form air gate spacers and air gate cap. The air gate spacers and air gate cap can effectively reduce the stray capacitance between gate stacks and nearby conductors such as S/D contacts. The air gate spacers and air gate cap can also reduce or eliminate metal leakage to and from metal gates, thereby increasing long-term reliability of the device. Embodiments of the present disclosure can be readily integrated into existing semiconductor manufacturing processes.

In one example aspect, the present disclosure is directed to a method that includes providing a structure having a gate stack; two first gate spacers respectively over two opposing sidewalls of the gate stack; a second gate spacer over one of the first gate spacers and having an upper portion over a lower portion, the lower portion extending from the upper portion and away from the gate stack; a dummy spacer disposed over the lower portion of the second gate spacer and on a sidewall of the upper portion of the second gate spacer; an etch stop layer on a sidewall of the dummy spacer and over the lower portion of the second gate spacer; and a dummy cap over the gate stack and between the two first gate spacers. The method further includes removing the dummy cap, resulting in a first void above the gate stack and between the two first gate spacers; removing the dummy spacer, resulting in a second void above the lower portion of the second gate spacer and between the etch stop layer and the upper portion of the second gate spacer; depositing a layer of a decomposable material into the first and the second voids; depositing a seal layer over the etch stop layer, the first and the second gate spacers, and the layer of the decomposable material; and after the depositing of the seal layer, removing the layer of the decomposable material, thereby reclaiming at least portions of the first and the second voids.

In an embodiment of the method, the removing of the layer of the decomposable material includes applying a thermal process that causes the decomposable material to sublime and escape out of the seal layer.

In an embodiment, the method further includes performing an etching back process to the layer of the decomposable material before the depositing of the seal layer. In a further embodiment, the performing of the etching back process recesses the layer of the decomposable material such that a top surface of the layer of the decomposable material is below a top surface of the etch stop layer, a top surface of the first gate spacers, and a top surface of the second gate spacer.

In an embodiment of the method, the seal layer includes one of $Si_3N_4$, ZrSi, SiCN, ZrAlO, $TiO_2$, $TaO_2$, $ZrO_2$, $La_2O_3$, ZrN, SiC, ZnO, SiOC, $HfO_2$, $Al_2O_3$, SiOCN, AlON, $Y_2O_3$, TaCN, and $SiO_2$. In a further embodiment, the seal layer is porous.

In some embodiment of the method, the decomposable material includes a polymer having one of $CF_4$ and $C_4F_6$. In some embodiments, the dummy cap is also over the etch stop layer, the first gate spacers, and the second gate spacer; and the first void also extends over the etch stop layer, the first gate spacers, and the second gate spacer after the dummy cap is removed.

In another example aspect, the present disclosure is directed to a method that includes providing a structure having a substrate, a fin extending from the substrate, a dummy gate over the substrate and engaging the fin, two first gate spacers respectively over two opposing sidewalls of the dummy gate, and a second gate spacer on a sidewall of one of the first gate spacers. The method further includes partially etching the second gate spacer until a top surface of the second gate spacer is below a top surface of the fin. After the partially etching of the second gate spacer, the method further includes depositing a third gate spacer over the first gate spacers and over the second gate spacer, wherein the third gate spacer includes an upper portion over a lower portion, the upper portion is on a sidewall of the first gate spacer, and the lower portion is over the fin and extends away from the dummy gate. The method further includes forming a dummy spacer over the lower portion of the third gate spacer and on a sidewall of the upper portion of the third gate spacer; forming an etch stop layer over the substrate and over a sidewall of the dummy spacer; replacing the dummy gate with a high-k metal gate; forming a gate cap over the high-k metal gate and between the two first gate spacers; forming a source/drain contact adjacent to the etch stop layer; and removing the gate cap and the dummy spacer, resulting in a first void above the high-k metal gate and between the two first gate spacers and a second void above the lower portion of the third gate spacer and between the etch stop layer and the upper portion of the third gate spacer.

In some embodiments of the method, the dummy spacer includes silicon or silicon germanium. In some embodiments, the removing of the gate cap and the dummy spacer includes a first etching process that removes the gate cap and a second etching process that removes the dummy spacer.

In an embodiment, the method further includes depositing a layer of a decomposable material into the first and the second voids; depositing a first seal layer over the layer of the decomposable material; and after the depositing of the first seal layer, removing the layer of the decomposable material, resulting in at least portions of the first and the second voids below the first seal layer. In an embodiment, the method further includes depositing a second seal layer over the first seal layer; and performing a chemical-mechanical planarization process to the first and the second seal layers. In some further embodiments, the removing of the layer of the decomposable material includes applying a thermal process or a UV irradiation process. In an embodiment, before the depositing of the first seal layer, the method further includes recessing the layer of the decomposable material such that a top surface of the layer of the decomposable material is below a top surface of the etch stop layer and a top surface of the third gate spacer, wherein the first seal layer is deposited directly on the top surface of the etch stop layer and the top surface of the third gate spacer.

In yet another example aspect, the present disclosure is directed to a semiconductor structure that includes a substrate; a semiconductor layer over the substrate; a gate stack over a top surface and a side surface of the semiconductor layer; two first gate spacers respectively over two opposing sidewalls of the gate stack and extending above a top surface of the gate stack; a second gate spacer over a sidewall of one of the first gate spacers and having an upper portion over a lower portion, the lower portion extending from the upper portion and away from the gate stack, the lower portion being above the top surface of the semiconductor layer; an etch stop layer adjacent to the lower portion of the second gate spacer and spaced away from the upper portion of the second gate spacer; and a first seal layer over the gate stack, the first gate spacers, the second gate spacer, and the etch stop layer, resulting in a first void and a second void below the first seal layer. The first void is above the lower portion of the second gate spacer and between the etch stop layer and the upper portion of the second gate spacer, and the second void is above the top surface of the gate stack and between the first gate spacers.

In an embodiment, the semiconductor structure further includes a third gate spacer over another sidewall of the one of the first gate spacers, wherein a top surface of the third gate spacer is below the top surface of the semiconductor layer.

In some embodiments of the semiconductor structure, the first seal layer is spaced away from the first gate spacers, the second gate spacer, and the etch stop layer. In some embodiments, the first seal layer directly contacts the first gate spacers, the second gate spacer, and the etch stop layer.

In an embodiment, the semiconductor structure further includes a source/drain contact over a sidewall of the etch stop layer, wherein the sidewall of the etch stop layer is between the source/drain contact and the first void.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a structure having: a gate stack; two first gate spacers respectively over two opposing sidewalls of the gate stack; a second gate spacer over one of the first gate spacers and having an upper portion over a lower portion, the lower portion extending from the upper portion and away from the gate stack; a dummy spacer disposed over the lower portion of the second gate spacer and on a sidewall of the upper portion of the second gate spacer; an etch stop layer on a sidewall of the dummy spacer and over the lower portion of the second gate spacer; and a dummy cap over the gate stack and between the two first gate spacers;
   removing the dummy cap, resulting in a first void above the gate stack and between the two first gate spacers;
   removing the dummy spacer, resulting in a second void above the lower portion of the second gate spacer and between the etch stop layer and the upper portion of the second gate spacer;
   depositing a layer of a decomposable material into the first and the second voids;
   depositing a seal layer over the etch stop layer, the first and the second gate spacers, and the layer of the decomposable material; and
   after the depositing of the seal layer, removing the layer of the decomposable material, thereby reclaiming at least portions of the first and the second voids.

2. The method of claim 1, wherein the removing of the layer of the decomposable material includes applying a thermal process that causes the decomposable material to sublime and escape out of the seal layer.

3. The method of claim 1, further comprising:
   performing an etching back process to the layer of the decomposable material before the depositing of the seal layer.

4. The method of claim 3, wherein the performing of the etching back process recesses the layer of the decomposable material such that a top surface of the layer of the decomposable material is below a top surface of the etch stop layer, a top surface of the first gate spacers, and a top surface of the second gate spacer.

5. The method of claim 1, wherein the seal layer includes one of: $Si_3N_4$, ZrSi, SiCN, ZrAlO, $TiO_2$, $TaO_2$, $ZrO_2$, $La_2O_3$, ZrN, SiC, ZnO, SiOC, $HfO_2$, $Al_2O_3$, SiOCN, AlON, $Y_2O_3$, TaCN, and $SiO_2$.

6. The method of claim 5, wherein the seal layer is porous.

7. The method of claim 1, wherein the decomposable material includes a polymer having one of $CF_4$ and $C_4F_6$.

8. The method of claim 1, wherein the dummy cap is also over the etch stop layer, the first gate spacers, and the second gate spacer; and the first void also extends over the etch stop layer, the first gate spacers, and the second gate spacer after the dummy cap is removed.

9. A method, comprising:
   providing a structure having a substrate, a fin extending from the substrate, a dummy gate over the substrate and engaging the fin, two first gate spacers respectively over two opposing sidewalls of the dummy gate, and a second gate spacer on a sidewall of one of the first gate spacers;
   partially etching the second gate spacer until a top surface of the second gate spacer is below a top surface of the fin;
   after the partially etching of the second gate spacer, depositing a third gate spacer over the first gate spacers and over the second gate spacer, wherein the third gate spacer includes an upper portion over a lower portion, the upper portion is on a sidewall of the first gate spacer, and the lower portion is over the fin and extends away from the dummy gate;
   forming a dummy spacer over the lower portion of the third gate spacer and on a sidewall of the upper portion of the third gate spacer;
   forming an etch stop layer over the substrate and over a sidewall of the dummy spacer;
   replacing the dummy gate with a high-k metal gate;
   forming a gate cap over the high-k metal gate and between the two first gate spacers;
   forming a source/drain contact adjacent to the etch stop layer; and
   removing the gate cap and the dummy spacer, resulting in a first void above the high-k metal gate and between the two first gate spacers and a second void above the lower portion of the third gate spacer and between the etch stop layer and the upper portion of the third gate spacer.

10. The method of claim 9, wherein the dummy spacer includes silicon or silicon germanium.

11. The method of claim 9, wherein the removing of the gate cap and the dummy spacer includes a first etching process that removes the gate cap and a second etching process that removes the dummy spacer.

12. The method of claim 9, further comprising:
   depositing a layer of a decomposable material into the first and the second voids;
   depositing a first seal layer over the layer of the decomposable material; and after the depositing of the first seal layer, removing the layer of the decomposable material, resulting in at least portions of the first and the second voids below the first seal layer.

13. The method of claim 12, further comprising:
depositing a second seal layer over the first seal layer; and
performing a chemical-mechanical planarization process to the first and the second seal layers.

14. The method of claim 12, wherein the removing of the layer of the decomposable material includes applying a thermal process or a UV irradiation process.

15. The method of claim 12, further comprising:
before the depositing of the first seal layer, recessing the layer of the decomposable material such that a top surface of the layer of the decomposable material is below a top surface of the etch stop layer and a top surface of the third gate spacer, wherein the first seal layer is deposited directly on the top surface of the etch stop layer and the top surface of the third gate spacer.

16. A method, comprising:
providing a structure having a substrate, a fin extending from the substrate, a dummy gate over the substrate and engaging the fin, two first gate spacers over two opposing sidewalls of the dummy gate and each having an L-shape, and second gate spacer on sidewalls of the first gate spacers and having a top surface that is even with or below a top surface of the fin;
depositing a third gate spacer over the first and the second gate spacers, wherein the third gate spacer includes an upper portion over a lower portion, the upper portion is on a sidewall of the first gate spacer, and the lower portion has a step profile;
forming a dummy spacer over the third gate spacer;
forming an etch stop layer over the substrate and over a sidewall of the dummy spacer;
replacing the dummy gate with a high-k metal gate;
forming a dummy gate cap over the high-k metal gate and between the two first gate spacers;
removing the dummy gate cap and the dummy spacer, resulting in a first void above the high-k metal gate and between the two first gate spacers and a second void above the lower portion of the third gate spacer and between the etch stop layer and the upper portion of the third gate spacer;
depositing a layer of a decomposable material into the first and the second voids;
depositing a first seal layer over the layer of the decomposable material; and
after the depositing of the first seal layer, removing the layer of the decomposable material, resulting in at least portions of the first and the second voids below the first seal layer.

17. The method of claim 16, wherein the dummy spacer includes silicon or silicon germanium.

18. The method of claim 16, wherein the first seal layer is porous and includes one of: $Si_3N_4$, ZrSi, SiCN, ZrAlO, $TiO_2$, $TaO_2$, $ZrO_2$, $La_2O_3$, ZrN, SiC, ZnO, SiOC, $HfO_2$, $Al_2O_3$, SiOCN, AlON, $Y_2O_3$, TaCN, and $SiO_2$.

19. The method of claim 16, further comprising:
before the depositing of the first seal layer, recessing the layer of the decomposable material such that a top surface of the layer of the decomposable material is below a top surface of the etch stop layer and a top surface of the third gate spacer.

20. The method of claim 16, further comprising:
depositing a second seal layer over the first seal layer; and
performing a chemical-mechanical planarization process to the first and the second seal layers.

* * * * *